(12) United States Patent
Kuwazawa

(10) Patent No.: US 7,557,845 B2
(45) Date of Patent: Jul. 7, 2009

(54) SOLID STATE IMAGING DEVICE INCORPORATING UNWANTED ELECTRIC CHARGE DISCHARGING CHANNEL AND METHOD OF DRIVING THE SAME

(75) Inventor: Kazunobu Kuwazawa, Chino (JP)

(73) Assignee: Seiko Epson Corporation (JP)

( * ) Notice: Subject to any disclaimer, the term of this patent is extended or adjusted under 35 U.S.C. 154(b) by 679 days.

(21) Appl. No.: 10/936,225

(22) Filed: Sep. 8, 2004

(65) Prior Publication Data

US 2005/0088553 A1     Apr. 28, 2005

(30) Foreign Application Priority Data

Sep. 9, 2003     (JP)     ............... 2003-316880

(51) Int. Cl.
*H04N 5/335*     (2006.01)
(52) U.S. Cl. ...................................... 348/297; 348/308
(58) Field of Classification Search ................. 348/294, 348/308, 299, 300, 301, 306, 373–375, 297; 257/292, 23
See application file for complete search history.

(56) References Cited

U.S. PATENT DOCUMENTS

| 4,782,394 | A | * | 11/1988 | Hieda et al. ................. 348/296 |
| 5,053,873 | A | * | 10/1991 | Taniji ......................... 348/243 |
| 5,343,297 | A | * | 8/1994 | Tiemann et al. ............. 348/301 |
| 5,426,515 | A | * | 6/1995 | Parker ........................ 358/483 |
| 5,631,187 | A | * | 5/1997 | Phipps et al. ............... 438/237 |
| 5,736,757 | A | * | 4/1998 | Paul ........................... 257/236 |
| 6,046,466 | A | * | 4/2000 | Ishida et al. ................ 257/258 |
| 6,448,596 | B1 | * | 9/2002 | Kawajiri et al. ............ 257/292 |
| 6,512,547 | B1 | * | 1/2003 | Miida ......................... 348/310 |
| 6,946,638 | B2 | * | 9/2005 | Kuwazawa et al. ....... 250/208.1 |
| 7,132,705 | B2 | * | 11/2006 | Kuwazawa .................. 257/292 |
| 2003/0137594 | A1 | * | 7/2003 | Koizumi et al. ............ 348/308 |
| 2005/0087781 | A1 | * | 4/2005 | Kuwazawa et al. ......... 257/291 |

FOREIGN PATENT DOCUMENTS

| JP | 09-139490 | * | 5/1997 |
| JP | 11-205689 | | 7/1999 |
| JP | 2001-145024 | | 5/2001 |
| JP | 2001-238132 | | 8/2001 |
| JP | 2002-134729 | | 5/2002 |

OTHER PUBLICATIONS

Communication from Japanese Patent Office regarding related application, Jan. 10, 2006.

* cited by examiner

*Primary Examiner*—Tuan V Ho
*Assistant Examiner*—Kent Wang
(74) *Attorney, Agent, or Firm*—Harness, Dickey & Pierce, P.L.C.

(57) ABSTRACT

A solid state imaging device comprises a substrate, a photoelectric conversion element, an accumulation well, a modulation well, a modulation transistor, a transfer control element, and an unwanted electric charge discharging control element. The photoelectric conversion element generates photo-generated electric charges corresponding to incident light, which are accumulated in the accumulation well. The transfer control element changes a potential barrier between the accumulation well and the modulation well. The modulation transistor has a channel threshold voltage controlled by the electric charges stored in the modulation well and outputs a pixel signal corresponding to the electric charges. The unwanted electric charge discharging control element discharges the electric charges that overflow from the accumulation well through the unwanted electric charge discharging channel. This discharging occurs during all periods except during a transfer period of the electric charges from the accumulation well to the modulation well by the transfer control element.

20 Claims, 17 Drawing Sheets

| | | reading cell | non-reading cell |
|---|---|---|---|
| single accumulating Sa | driving voltage potential | | R6=1.5/LOD=1.0/D=1.0/S=1.0V |
| transfer | driving voltage potential | | R6=0/LOD=2.5/D=4.0/S=0V |
| S/N modulation parallel accumulating Ss parallel accumulating Sn | driving voltage potential | R6=2.5/LOD=1.0/D=2.5/S=Vg-Vth | R6=1.5/LOD=1.0/D=2.5/S=Vg-Vth |
| clear parallel accumulating Sc | driving voltage potential | R6=7.0/LOD=1.0/D=5.0/S=5.0V | R6=1.5/LOD=1.0/D=5.0/S=5.0V |
| PD clear | driving voltage potential | | R6=1.5/LOD=0/D=4.0/S=High-Z |

| | | Reading cell | Non-reading cell |
|---|---|---|---|
| Single accumulating period Sa | Driving voltage Potential | | RG=0.0/TX=2.5/D=1.0/S=1.0<br>PKT S PKT FPW TX PD |

FIG. 15B

| | | Reading cell | Non-reading cell |
|---|---|---|---|
| Transfer | Driving voltage Potential | | RG=0/TX=0/D=4.0/S=0<br>PKT S PKT FPW TX PD |

FIG. 15C

| | | Reading cell | Non-reading cell |
|---|---|---|---|
| S/N modulation Parallel accumulation Ss Parallel accumulation Sn | Driving voltage Potential | RG=2.5/TX=2.5/D=2.5/S=Vg-Vth<br>PKT S PKT FPW TX PD | RG=0/TX=2.5/D=2.5/S=Vg-Vth<br>PKT S PKT FPW TX PD |

FIG. 15D

| | | Reading cell | Non-reading cell |
|---|---|---|---|
| Clear Parallel accumulation Sc | Driving voltage Potential | RG=7.0/TX=2.5/D=5.0/S=5.0V<br>PKT S PKT FPW TX PD | RG=0/TX=2.5/D=5.0/S=5.0V<br>PKT S PKT FPW TX PD |

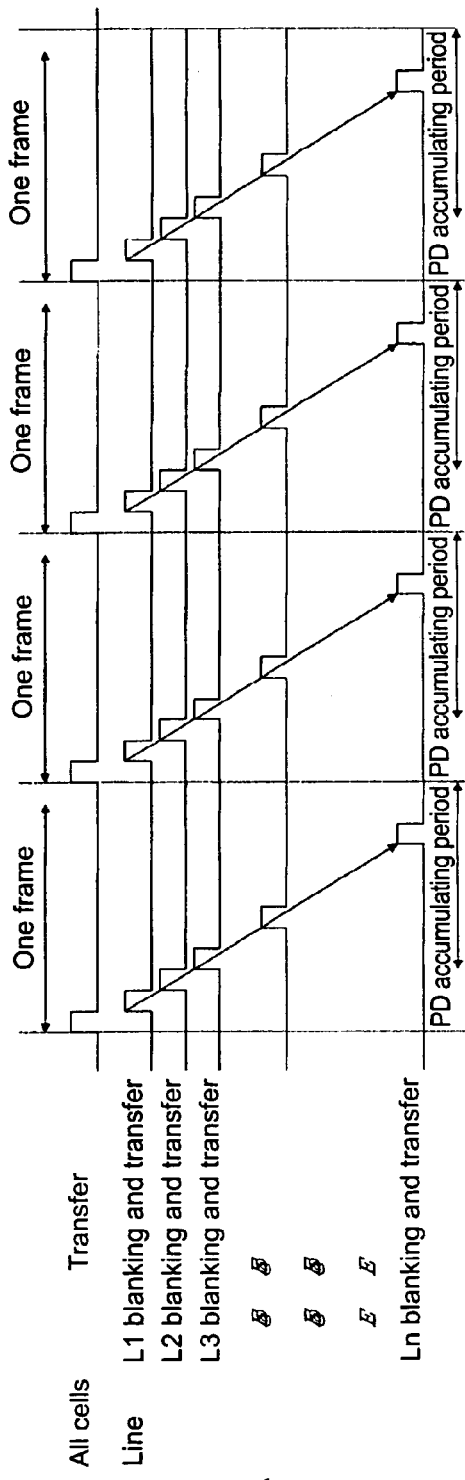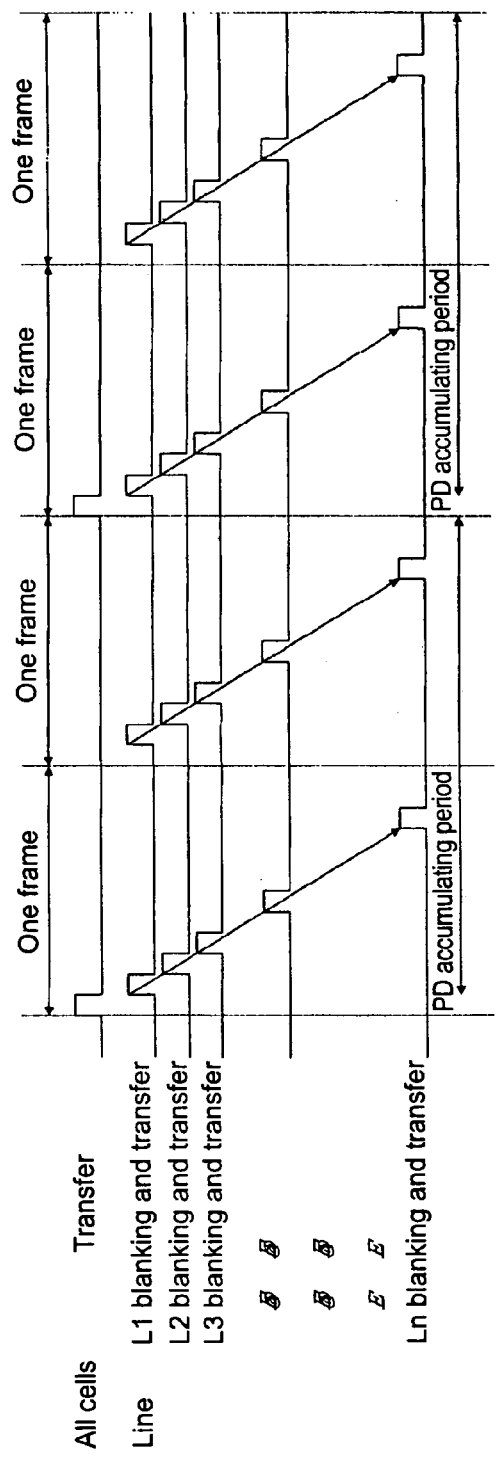

SOLID STATE IMAGING DEVICE INCORPORATING UNWANTED ELECTRIC CHARGE DISCHARGING CHANNEL AND METHOD OF DRIVING THE SAME

RELATED APPLICATIONS

This application claims priority to Japanese Patent Application No. 2003-316880 filed Sep. 9, 2003 which is hereby expressly incorporated by reference herein in its entirety.

BACKGROUND

1. Field of the Invention

The present invention relates to a solid state imaging device having a high quality image and low power consumption, and a method of driving the same.

2. Description of Related Art

Solid state imaging devices carried in cellular phones or the like include a CCD (charge coupled device) type image sensor and a CMOS type image sensor. The CCD type image sensor is excellent in image quality, and the CMOS type image sensor consumes lower power and its process cost is low. In recent years, MOS type solid state imaging devices using a threshold voltage modulation method which combines both a high quality image and low power consumption have been proposed. A MOS type solid state imaging device using the threshold voltage modulation method is disclosed in Japanese Unexamined Patent Publication No. 2002-134729, for example.

In the solid state imaging device of Japanese Unexamined Patent Publication No. 2002-134729, the image output is obtained by arranging unit pixels in a matrix form and repeating three states of initialization, accumulation, and reading. Moreover, in the solid state imaging device of Japanese Unexamined Patent Publication No. 2002-134729, each unit pixel has a photo-diode, a modulation transistor, and an overflow drain gate. The gate of the modulation transistor is formed in a ring shape.

Electric charges (photo-generated electric charges) generated by light incident upon the photo-diode are transferred to a P-type well region formed under a ring gate, and accumulated in a carrier pocket formed in this region. The threshold voltage of the modulation transistor changes corresponding to the photo-generated electric charges accumulated in the carrier pocket. Accordingly, a signal (pixel signal) corresponding to incident light is obtained from a terminal coupled to the source region of the modulation transistor.

In the solid state imaging device of Japanese Unexamined Patent Publication No. 2002-134729, in order to prevent distortion produced when imaging a moving object, an image made by an optical signal is simultaneously taken in on an entire light-receiving surface, and the optical signal thereof is converted to an electric signal and output as an image signal. However, in this reading method, an accumulating period and a reading period cannot be controlled for each pixel because the image made by the optical signal is simultaneously taken in on an entire light-receiving surface. Therefore, while specific pixels are being read, the accumulation operation cannot be carried out in other pixels, and as a result the frame rate cannot be increased.

Furthermore, in the solid state imaging device of Japanese Unexamined Patent Publication No. 2002-134729, a part of the photo-generated electric charges generated in the photo-diode is discharged to the substrate through the overflow-drain region formed in a P type layer.

Incidentally, in an N type layer which constitutes the photo-diode, as the peak of impurity concentration becomes deeper perpendicularly downward in the substrate, the wavelength range of photoelectric-convertible incident light becomes wider. That is, taking a higher quality image into consideration, the depth of the N type layer needs to be sufficiently deep. On the other hand, the overflow-drain region is composed of a deep P type layer extending from underneath an overflow drain gate to the rear surface of the substrate. This P type layer is formed by implanting P type impurities after forming the above-mentioned N type layer. Therefore, in order to form the overflow-drain region composed of a deep P type layer, the ion-implanting energy needs to be increased. Generally, the area of an impurity region formed by increased ion-implanting energy increases. That is, the area of the overflow-drain region will increase. Therefore, there is a tradeoff between a higher quality image and miniaturization, and there is also a problem that a solid state imaging device cannot be miniaturized if the N type layer is deepened for achieving a higher quality image.

The present invention has been made in view of the above described problems, and is intended to provide a solid state imaging device and a method of driving the same which can attain a higher quality image and miniaturization while speeding up the frame rate by allowing the accumulating period and the reading period to be set to a common timing.

SUMMARY

A solid state imaging device according to the present invention includes: a substrate; a photoelectric conversion element formed in the substrate and that generates photo-generated electric charges corresponding to incident light; an accumulation well that accumulates the photo-generated electric charges; a modulation well that stores the photo-generated electric charges transferred from the accumulation well; a modulation transistor whose channel threshold voltage is controlled by the photo-generated electric charges stored in the modulation well and that outputs a pixel signal corresponding to the photo-generated electric charges; a transfer control element that changes a potential barrier of a photo-generated electric charge transfer channel between the accumulation well and the modulation well, and controls transfer of the photo-generated electric charges; and an unwanted electric charge discharging control element that controls the potential barrier of an unwanted electric charge discharging channel coupled to the accumulation well, the unwanted electric charge discharging control element discharging the photo-generated electric charges that overflow from the accumulation well through the unwanted electric charge discharging channel during a period except a transfer period of the photo-generated electric charges from the accumulation well to the modulation well by the transfer control element.

According to the embodiment of the present invention, photo-generated electric charges generated by the photoelectric conversion element are accumulated in the accumulation well. The photo-generated electric charges accumulated in the accumulation well are transferred to the modulation well through the transfer channel. The channel threshold voltage of the modulation transistor is controlled by the photo-generated electric charges stored in the modulation well, and a pixel signal corresponding to the photo-generated electric charges is outputted from the modulation transistor. The transfer control element can control transfer of the photo-generated electric charges by changing the potential barrier of the transfer channel. Moreover, the unwanted electric charge discharging control element controls the potential barrier of the unwanted electric charge discharging channel coupled to the accumulation well, and discharges the electric charges that overflow from the accumulation well through the unwanted electric charge discharging channel during the period other than the transfer period of the photo-generated electric charges from the accumulation well to the modulation well by the transfer control element. Accordingly, in the reading period of a pixel signal from the modulation transistor, the photo-generated electric charges can be accumulated in the accumulation well while transfer of the photo-generated electric charges from the accumulation well to the modulation well is prevented. Moreover, when a strong light enters or the like, the electric charges, which are generated in the accumulation well and overflow, are discharged to the outside through the unwanted electric charge discharging channel. Thus, even if the reading period and the accumulating period are set to a common timing, secured accumulation and reading can be attained.

Moreover, the unwanted electric charge discharging control element determines the accumulating period of the photo-generated electric charges in the accumulation well by discharging the photo-generated electric charges accumulated in the accumulation well at a predetermined timing.

According to the embodiment of the present invention, the photo-generated electric charges are securely accumulated in the accumulation well by controlling the potential barrier of the transfer channel and the unwanted electric charge discharging channel. By discharging the photo-generated electric charges accumulated in the accumulation well at a predetermined timing, accumulation of the photo-generated electric charges in the accumulation well is initiated from this discharge timing. Accumulation of the photo-generated electric charges is completed by transferring the photo-generated electric charges accumulated in the accumulation well to the modulation well through the transfer channel in the transfer period. Thus, by discharging the photo-generated electric charges through the unwanted electric charge discharging channel, the accumulating period can be set without restraint, thereby enabling imaging not only in a normal mode but in a high-speed shutter mode and in a low-speed shutter mode.

Moreover, the unwanted electric charge discharging channel is coupled to an external wiring through a terminal on the substrate.

According to the embodiment of the present invention, the electric charges accumulated in the accumulation well are discharged from the unwanted electric charge discharging channel to the external wiring via a terminal on the substrate. Therefore, it is not necessary to form a discharging channel by a diffusion layer in the depth direction of the substrate. Accordingly, even if the depth direction of the substrate in a photoelectric conversion element formation region is deepened for attaining a higher quality image, a large area is not needed in the discharging channel, and miniaturization can be attained.

A method of driving a solid state imaging device according to the present invention comprises: an accumulation well that accumulates photo-generated electric charges generated by a photoelectric conversion element corresponding to incident light; a modulation well that controls a threshold voltage of a channel of a modulation transistor by storing the photo-generated electric charges; a transfer control element that controls the potential barrier of a transfer channel between the accumulation well and the modulation well; and an unwanted electric charge discharging control element that controls the potential barrier of an unwanted electric charge discharging channel coupled to the accumulation well. The method comprises: a single accumulation step of controlling a potential barrier of the transfer channel and the unwanted electric charge discharging channel by the transfer control element and the unwanted electric charge discharging control element, and accumulating the photo-generated electric charges by the photoelectric conversion element into the accumulation well so that the photo-generated electric charges will not flow to the modulation well at least through the transfer channel; a reading step comprising: a signal component modulation step of outputting a pixel signal corresponding to the photo-generated electric charges from the modulation transistor, while having the modulation well store the photo-generated electric charges by controlling the potential barrier of the transfer channel by the transfer control element; a discharging step of discharging a residual electric charges of the modulation well; and a noise component modulation step of controlling the potential barrier of the transfer channel by the transfer control element and reading a noise component from the modulation transistor after the discharging step; the method further comprises; a parallel accumulation step of controlling the potential barrier of the transfer channel and the unwanted electric charge discharging channel by the transfer control element and the unwanted electric charge discharging control element, and accumulating photo-generated electric charges by the photoelectric conversion element into the accumulation well so that the photo-generated electric charges will not flow to the modulation well at least through the transfer channel during the same period as the signal component modulation step, the discharging step, and the noise component modulation step; and a transfer step of controlling the potential barrier of the transfer channel by the transfer control element, and transferring and storing the photo-generated electric charges accumulated in the accumulation well to the modulation well.

According to the embodiment of the present invention, the photo-generated electric charges generated by the photoelectric conversion element are accumulated in the accumulation well in the single accumulation step, at least without flowing into the modulation well side. Moreover, the parallel accumulation step is carried out in the same period as the reading step including the signal component modulation step of outputting a pixel signal corresponding to the photo-generated electric charges from the modulation transistor, the discharging step of discharging the residual electric charges in the modulation well, and the noise component modulation step of reading a noise component from the modulation transistor after the discharging step. Accordingly, photo-generated electric charges by the photoelectric conversion element will be accumulated in the accumulation well, without flowing into the modulation well at least through the transfer channel. The photo-generated electric charges accumulated in the accumulation well in the single accumulation step and the parallel accumulation step are transferred and stored to the modulation well in the transfer step. The reading corresponding to the photo-generated electric charges stored in the modulation well is carried out in the reading step. During the reading period in the reading step, accumulation of the photo-generated electric charges is carried out simultaneously, thereby enabling a speeding up of the frame rate.

The transfer step is carried out after the single accumulation step, the reading step and the parallel accumulation step carried out in the same period are repeated a number of times based on the number of lines per screen.

According to the embodiment of the present invention, the accumulation operation in the single accumulation step and the parallel accumulation step are carried out at the same time of reading all lines that is carried out from the transfer step to the following transfer step. Accumulation in one screen period except the transfer period can be carried out.

Moreover, the method further includes an initialization step of controlling the potential barrier of the transfer channel and the unwanted electric charge discharging channel by the transfer control element and the unwanted electric charge discharging control element during an arbitrary period within one screen period, and discharging the photo-generated electric charges, which are accumulated in the accumulation well, through the unwanted electric charge discharging channel, wherein the transfer step is carried out, after the single accumulation step, the reading step and the parallel accumulation step that are carried out in the same period are repeated a number of times based on the number of lines per screen and the timing within one screen period in the initialization step.

According to the embodiment of the present invention, accumulation of the photo-generated electric charges of the accumulation well is initiated from the completion timing of this arbitrary period by discharging the photo-generated electric charges accumulated in the accumulation well in an arbitrary period within one screen period. Accumulation of the photo-generated electric charges is completed upon the photo-generated electric charges accumulated in the accumulation well being transferred to the modulation well through the transfer channel. Thus, corresponding to the timing of discharging the photo-generated electric charges through the unwanted electric charge discharging channel, the accumulating period can be set without restraint, and imaging not only in the normal mode but in the high-speed shutter mode and in the low-speed shutter mode can be attained.

Moreover, the method includes a high-speed shutter mode wherein the period from the initialization step to the transfer step is shorter than one screen period.

According to the embodiment of the present invention, the accumulating period can be shortened, and even if an extremely bright light enters, an entire image can be prevented from becoming whitish (washed out) to degrade the contrast thereof.

Moreover, the method includes a low-speed shutter mode wherein the period from the initialization step to the transfer step is longer than one screen period.

According to the embodiment of the present invention, the accumulating period can be increased, and even if incident light is extremely dark, an image with sufficient brightness can be obtained.

BRIEF DESCRIPTION OF THE DRAWINGS

FIGS. 7A-E are diagrams showing the potential relationship for each section in the same period.

FIGS. 15A-D are diagrams showing the potential relationship for the same period of each section of the second embodiment.

FIGS. 17A-B are timing charts showing the driving sequence of the second embodiment.

DETAILED DESCRIPTION

Figure 1:
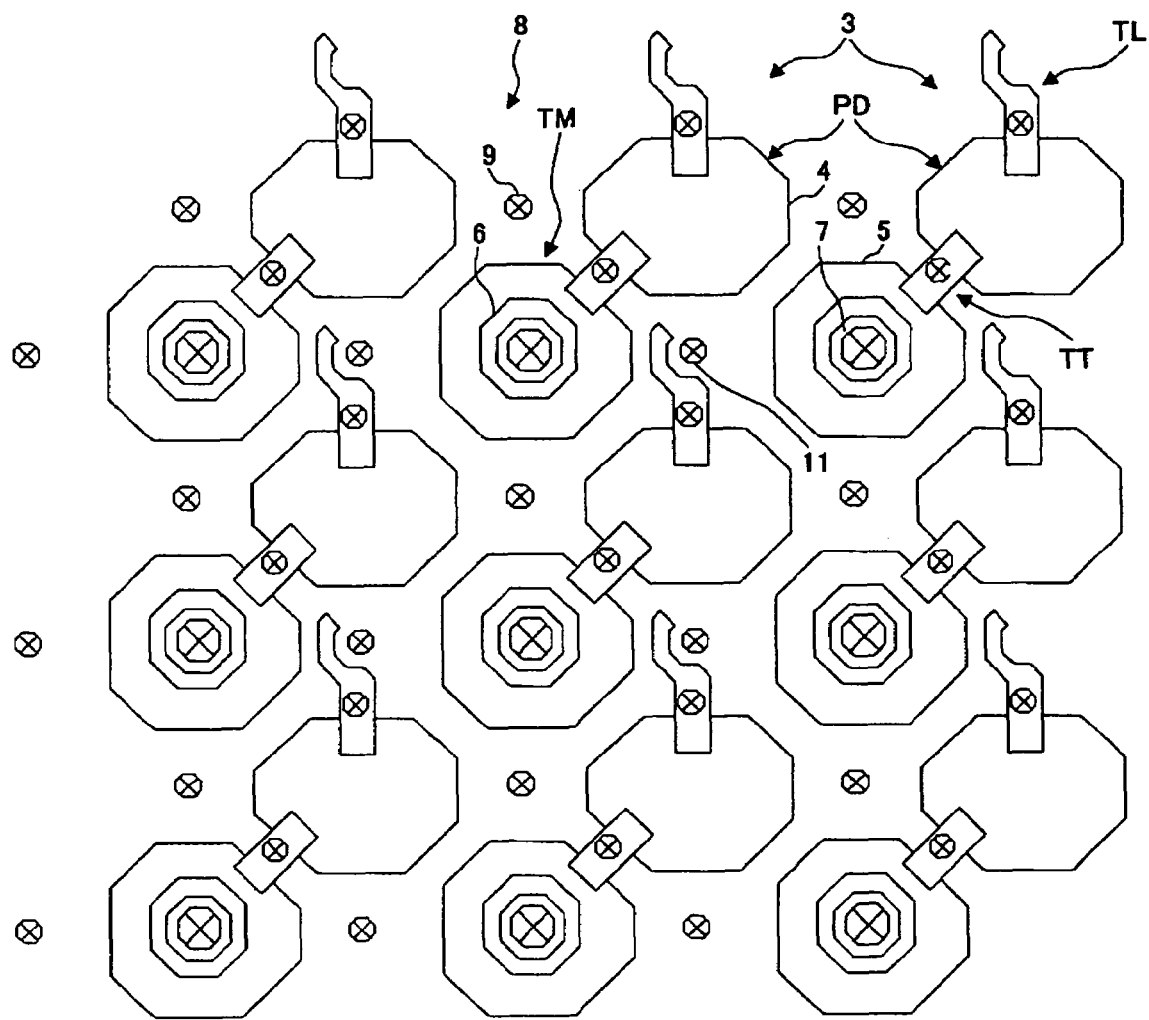
FIG. 1 is a plan view showing the planar shape of a solid state imaging device of a first embodiment of the present invention.
Figure 2:
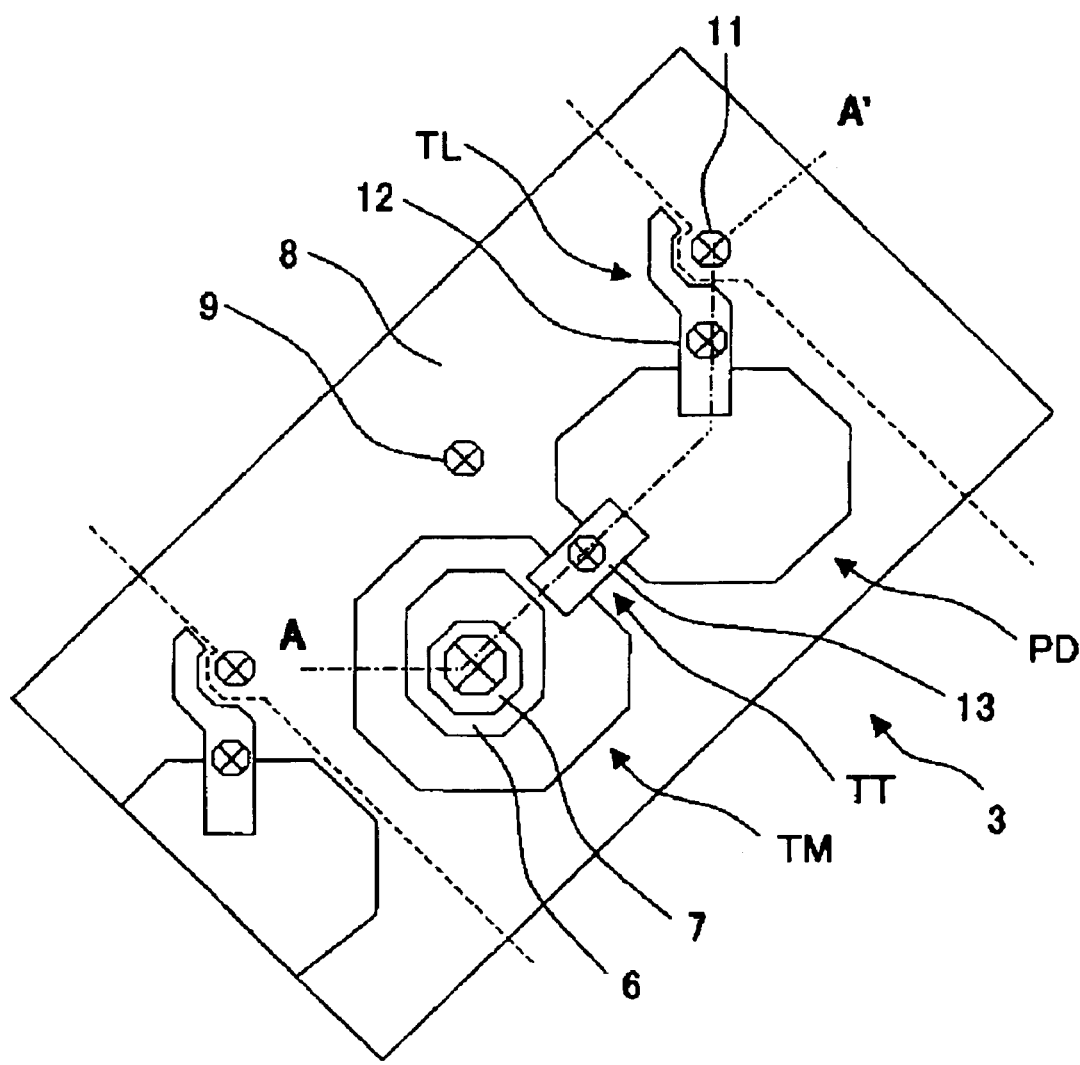
FIG. 2 is a plan view showing the planar shape of one cell of FIG. 1.
Figure 3:
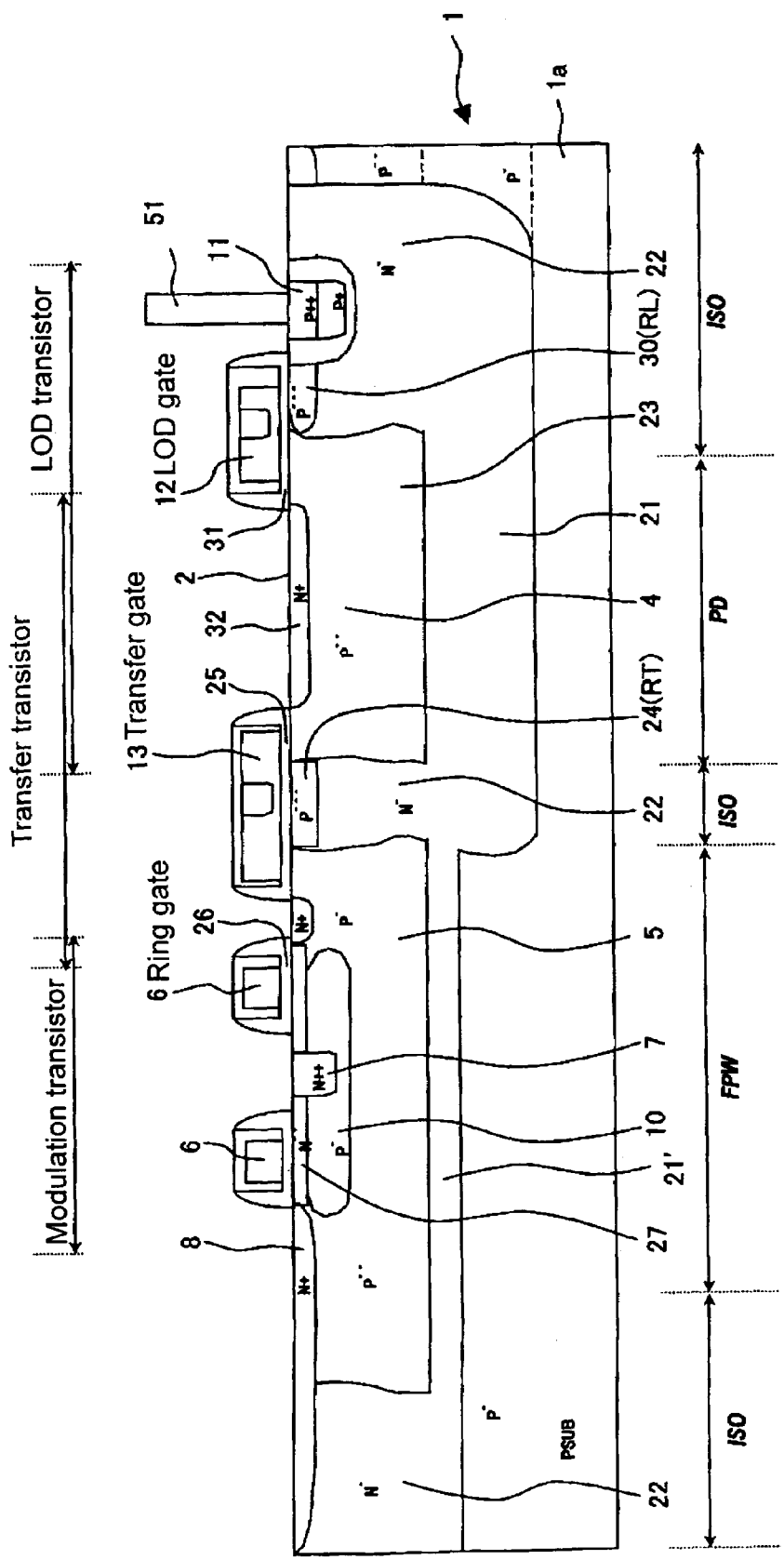
FIG. 3 is a cross-sectional view showing the cross-section cut along the A-A' line of FIG. 2.
Figure 4:
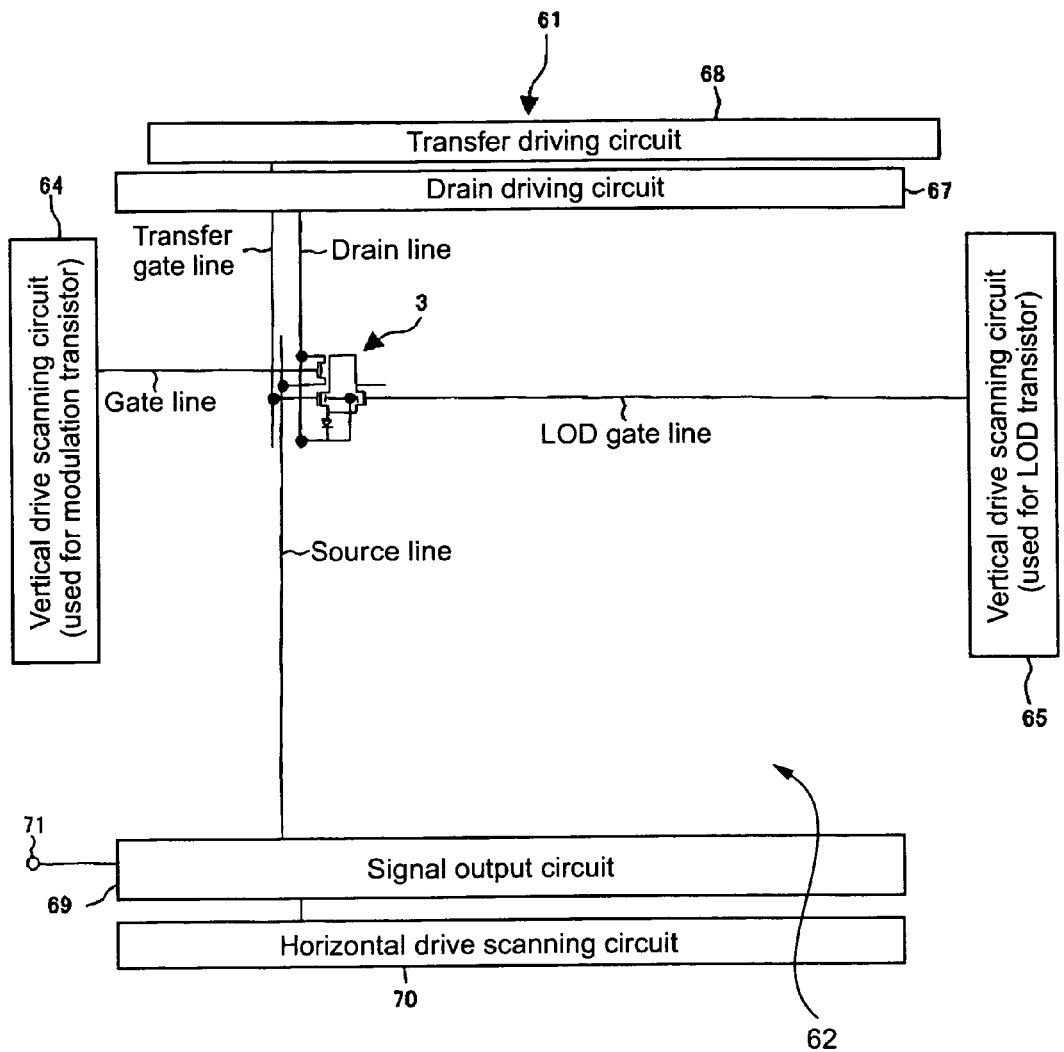
FIG. 4 is a block diagram showing the whole structure of the element.
Figure 8:
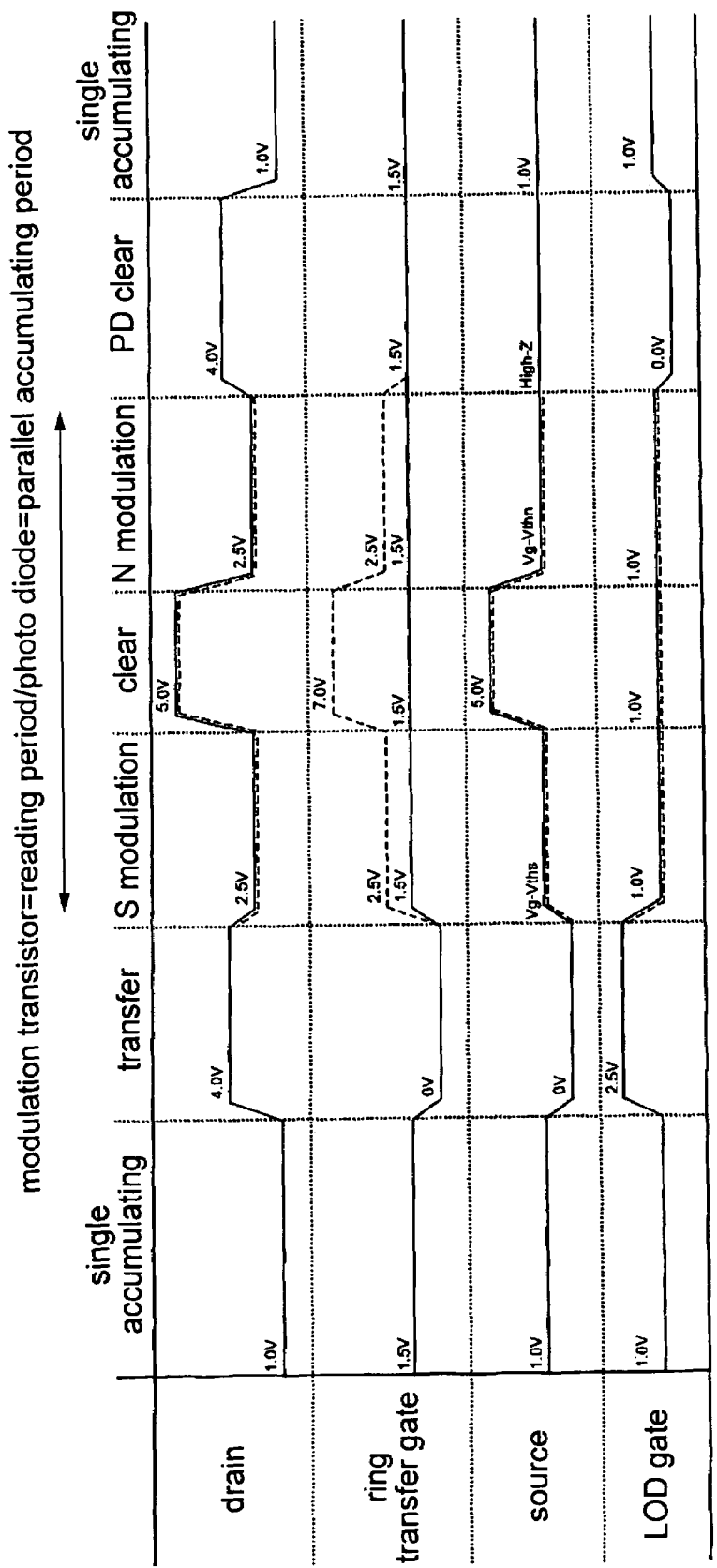
FIG. 8 is a diagram showing changes of the driving voltage in each period in the driving sequence.
Figure 9:
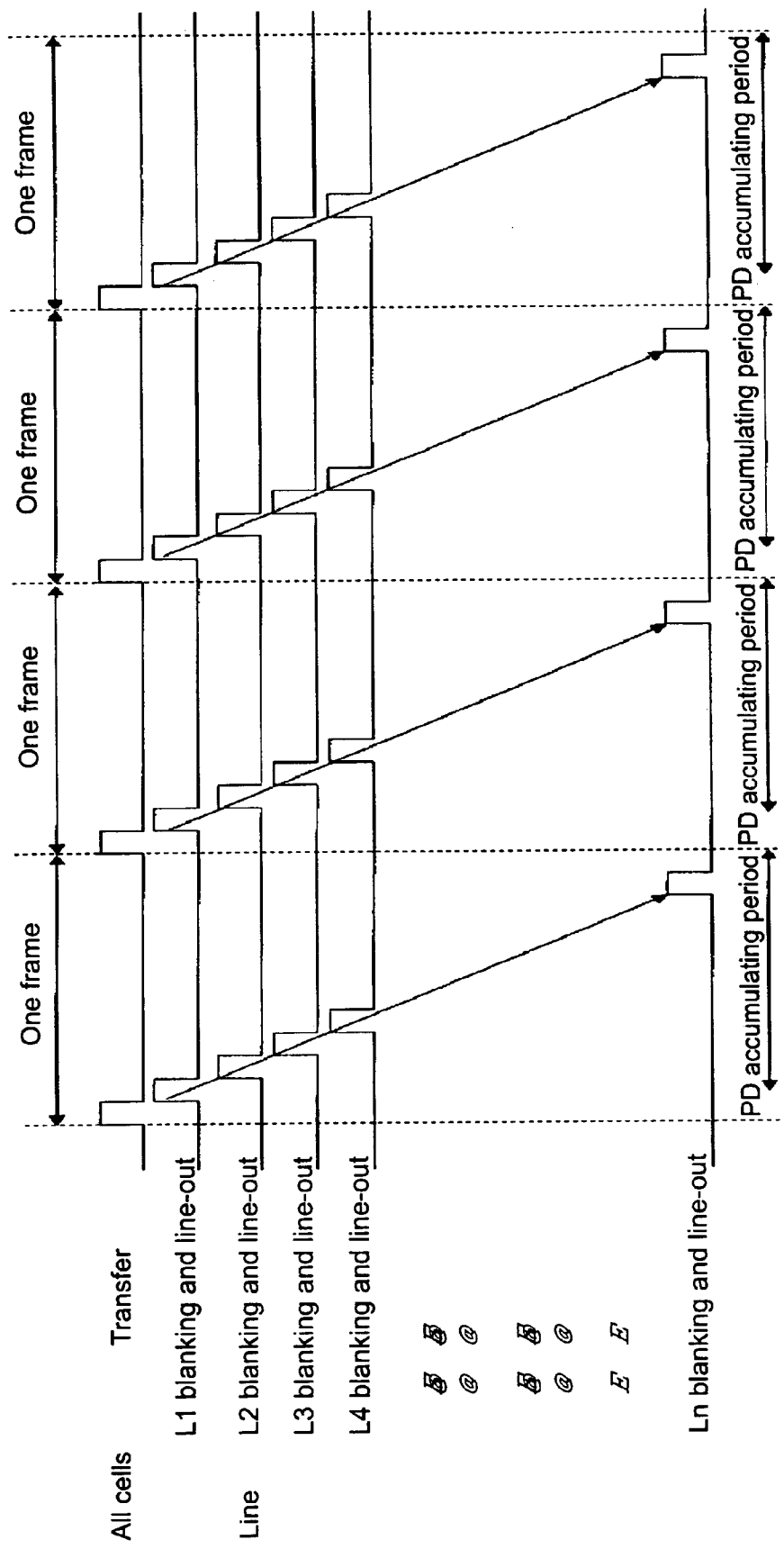
FIG. 9 is a timing chart showing a driving sequence.

Hereinafter, embodiments of the present invention will be described in detail with reference to accompanying drawings. FIG. 1 through FIG. 10 are related to a first embodiment of the present invention, and FIG. 1 is a plan view showing a planar shape of a solid state imaging device of the embodiment, FIG. 2 is a plan view showing a planar shape of one cell of FIG. 1, and FIG. 3 is a cross-sectional view showing a cross-section cut along the A-A' line of FIG. 2. FIG. 4 is a block diagram showing the whole structure of the element, and FIG. 5 is an equivalent circuit diagram of a sensor cell. FIG. 6 is a timing chart for illustrating the outline of each driving period in the embodiment. FIG. 7 is a diagram showing potential relationship for the same period of each section, and FIG. 8 is a diagram showing changes of the driving voltage for each period in the driving sequence. FIG. 9 and FIG. 10 are timing charts showing driving sequences.

The solid state imaging device of the present embodiment includes the photoelectric conversion element, the accumulation well, the modulation well, and the modulation transistor. In the present embodiment, the photoelectric conversion element is a photo-diode. The accumulation well is provided in a photoelectric conversion element formation region, and accumulates electric charges (hereinafter, referred to as photo-generated electric charges) generated by the photoelectric conversion element. The modulation well is provided in the modulation transistor formation region, and stores the photo-generated electric charges transferred from the accumulation well. The threshold of the modulation transistor is modulated by the photo-generated electric charges stored in the modulation well, based on which the modulation transistor outputs the pixel signal.

Moreover, the solid state imaging device of the present embodiment includes a photo-generated electric charge transfer channel and a transfer control element. The photo-generated electric charge transfer channel is provided between the accumulation well and the modulation well. The photo-generated electric charges are transferred from the accumulation well to the modulation well through the photo-generated electric charge transfer channel. The transfer control element controls the potential barrier of the photo-generated electric charge transfer channel, and moves photo-generated electric charges to the modulation well from the accumulation well. In the present embodiment, the transfer control element is a transfer transistor. The accumulation well and the modulation well are independently separated in terms of potential by the transfer control element. Accordingly, the accumulating period and the reading period (hereinafter, referred to as a blanking period) can be set within the same period, and consequently the frame rate can be increased.

Furthermore, the solid state imaging device of the present embodiment includes the unwanted electric charge discharging channel, a contact region for discharging unwanted electric charges, and an unwanted electric charge discharging control element. The unwanted electric charge discharging channel is provided between the accumulation well and the contact region for discharging unwanted electric charges, and provided approximately horizontally along the substrate surface. The unwanted electric charge discharging channel is electrically coupled to a wiring layer provided on the substrate through the contact region for discharging unwanted electric charges. Electric charges that are unnecessary (hereinafter, referred to as unwanted electric charges) which overflow from the accumulation well without being accumulated in the accumulation well and do not contribute to the image signal, are transferred to the contact region for discharging unwanted electric charges from the accumulation well through the unwanted electric charge discharging channel. The contact region for discharging unwanted electric charges is formed inside the unwanted electric charge discharging channel. The unwanted electric charge discharging control element controls the potential barrier of the unwanted electric charge discharging channel, and discharges unwanted electric charges from the accumulation well to the wiring layer. In the present embodiment, the unwanted electric charge discharging control element is a lateral-overflow-drain (hereinafter, referred to as LOD) transistor. Unwanted electric charges are not directly discharged perpendicularly downward of the substrate from either one of the accumulation well and the contact region for discharging unwanted electric charges. That is, unwanted electric charges are displaced approximately horizontally along the substrate surface, namely in the substrate lateral direction, and are then discharged to the wiring layer formed on the substrate. Accordingly, miniaturization can be attained, even if the depth of the impurity layer in the photoelectric conversion element formation region is deepened to attain a higher quality image.

Structure of Sensor Cell

The solid state imaging device according to the present embodiment has a sensor cell array constituted by arranging sensor cells, which are unit pixels, in a matrix form, as will be described later. Each sensor cell accumulates photo-generated electric charges generated corresponding to incident light, and outputs the pixel signal with a level based on the accumulated photo-generated electric charges. The image signal of one screen is obtained by arranging the sensor cells in a matrix form.

First, the structure of each sensor cell will be described with reference to FIG. 1 through FIG. 3. FIG. 1 shows a sensor cell with 3 horizontal pixels×3 perpendicular pixels, and FIG. 2 shows one sensor cell. In addition, one sensor cell is a region shown with the dashed lines of FIG. 2. In addition, the present embodiment shows an example using holes as photo-generated electric charges. In the case of using electrons as photo-generated electric charges, the same can be constructed. Moreover, FIG. 3 shows a cross-sectional structure of the cell cut along the A-A' line of FIG. 2.

As shown in the plan views of FIG. 1 and FIG. 2, the photo-diode PD and the modulation transistor TM are adjacently formed in a sensor cell 3 which is a unit pixel. As for the modulation transistor TM, an N channel depletion MOS transistor is used, for example. The unit pixel has an almost rectangular shape, each side of which is inclined to the row or line direction of the sensor cell array.

In the photo-diode PD formation region (PD of FIG. 3), an opening region 2 is formed on the surface of the substrate 1, and an accumulation well 4, which is a P type well with a region wider than the opening region 2, is formed in the relatively shallow position of the substrate 1 surface. The modulation well 5 which is a P type well is formed in a modulation transistor TM formation region (FPW of FIG. 3) with a predetermined space apart from this accumulation well 4.

On the modulation well 5, a ring-shaped gate (ring gate) 6 is formed in the substrate 1 surface, and a source region 7 which is a high concentration N type region is formed in the region near the substrate 1 surface of the center opening portion of the ring gate 6. An N type drain region 8 is formed in the surroundings of the ring gate 6. A drain contact region 9 of an N+ layer is formed in a predetermined position of a drain region 8 near the substrate 1 surface.

The modulation well 5 controls the threshold voltage of the channel of the modulation transistor TM. In the modulation well 5, a carrier pocket 10 (FIG. 3) which is a P type high concentration region under the ring gate 6 is formed. The modulation transistor TM is constituted by the modulation well 5, the ring gate 6, the source region 7, and the drain region 8, and the threshold voltage of the channel changes corresponding to the electric charges accumulated in the modulation well 5 (carrier pocket 10).

A depletion region (not shown) is formed in the boundary region of an N type well 21, which will be described later, and the P type accumulation well 4 which are formed on the substrate 1 under the opening region 2 of the photo diode PD, and photo-generated electric charges generated by incident light through the opening region 2 are generated in this depletion region. In the present embodiment, the photo-generated electric charges generated are accumulated in the accumulation well 4.

The electric charges accumulated in the accumulation well 4 are transferred to the modulation well 5, and are stored in the carrier pocket 10. Accordingly, the source potential of the modulation transistor TM becomes the one corresponding to the amount of the electric charges transferred to the modulation well 5, i.e., to the incident light upon the photo diode PD.

A contact region 11 for discharging unwanted electric charges (hereinafter, referred to as an OD contact region), including electric charges that overflow, is formed by a high concentration P type diffusion layer in the substrate 1 surface near the accumulation well 4. On the substrate 1 surface between this OD contact region 11 and the accumulation well 4 region, an LOD gate 12 of an LOD transistor TL for forming a channel RL for the unwanted electric charges (hereinafter, referred to as unwanted electric charge discharging channel) including the electric charges that overflow between the OD contact region 11 and the accumulation well 4 region is formed. In addition, one end of the LOD gate two-dimensionally hangs over the accumulation well 4 region.

In the present embodiment, the transfer transistor TT is formed between the accumulation well 4 and the modulation well 5. The transfer gate 13 of the transfer transistor TT is formed on the substrate 1 surface of the channel RT between the accumulation well 4 and the modulation well 5 (hereinafter, simply referred to the transfer channel). The electric charges transfer from the accumulation well 4 to the modulation well 5 can be controlled by controlling the potential barrier of the transfer channel RT by the transfer transistor TT.

Cross-Section of Sensor Cell

Furthermore, with reference to FIG. 3, the cross-sectional structure of the sensor cell 3 will be described in detail. Incidentally, the subscripts, "−" and "+", of N and P in FIG. 3 indicate the state of a portion from lighter impurity concentration (subscript $^{---}$) to heavier impurity concentration (subscript $^{+++}$), depending on the number of the subscript.

FIG. 3 shows the modulation transistor TM formation region (FPW) and the photo-diode PD formation region (PD) for approximately one unit pixel (cell). An isolation region (ISO) is provided between the photo-diode PD formation region and the modulation transistor TM formation region in a cell and between adjoining cells.

On a P type substrate 1$a$ of the photo-diode PD formation region, the N type well 21 of N$^-$ is formed at a deep position of the substrate. On the other hand, on the P type substrate 1$a$ of the modulation transistor TM formation region, an N type well 21' of N– is formed at a relatively shallow position of the substrate. An isolation region 22 for isolating elements is formed by an N$^-$ layer on these N type wells 21 and 21'. On the N type well 21, P$^{--}$ layer 23 is formed across all the elements except for the isolation region 22.

The P$^{--}$ layer 23 in the photo-diode PD formation region functions as the accumulation well 4. The P–– layer 23 in the modulation transistor TM formation region functions as the modulation well 5, and in this modulation well 5, the carrier pocket 10 is formed by P–diffusion.

The transfer transistor TT is formed on the substrate surface side in the isolation region 22 between the photo-diode PD formation region, and the modulation transistor TM formation region in the cell. The transfer transistor TT is constituted by forming a P$^{---}$ diffusion layer 24, which constitutes a channel on the substrate surface, and the transfer gate 13 on the substrate surface through a gate insulating layer 25. This P$^{---}$ diffusion layer 24, being coupled to the accumulation well 4 and the modulation well 5, constitutes the transfer channel RT, and the potential barrier of this transfer channel RT is controlled corresponding to the applied voltage to the transfer gate 13.

In the modulation transistor TM formation region, the ring gate 6 is formed in the substrate surface through a gate insulation layer 26, and N$^{--}$ diffusion layer 27 which constitutes a channel is formed in the substrate surface under the ring gate 6. An N$^{++}$ diffusion layer is formed in the substrate surface of the center of the ring gate 6 to constitute the source region 7. Moreover, an N$^+$ diffusion layer is formed in the substrate surface in the periphery of the ring gate 6 to constitute the drain region 8. The N–– diffusion layer 27 which constitutes a channel is coupled to the source region 7 and the drain region 8.

An OD contact region 11 is formed, at the substrate surface side, in the isolation region 22 between the photo-diode PD formation regions and the modulation transistor TM formation regions of adjoining cells. The OD contact region 11 is obtained by forming a P$^{++}$ diffusion layer in the substrate surface.

The LOD transistor TL is formed at the substrate surface side between the photo-diode PD formation region and the OD contact region 11. The LOD transistor TL is constituted by forming P$^{---}$ diffusion layer 30 which constitutes a channel in the substrate surface between the photo-diode PD formation region and the OD contact region 11, and forming the LOD gate 12 through the gate insulating layer 31 in the substrate surface. This P$^{---}$ diffusion layer 30, being coupled to the accumulation well 4 and the OD contact region 11, constitutes the unwanted electric charge discharging channel RL, and the potential barrier of this unwanted electric charge discharging channel RL is controlled corresponding to the applied voltage to the LOD gate 12.

In addition, an N$^+$ diffusion layer 32 is formed at the substrate surface side of the photo-diode PD formation region.

A wiring layer (not shown) is formed in the substrate surface through an interlayer insulation layer (not shown). The LOD gate 12, the transfer gate 13, the OD contact region 11, the source region 7, and the drain contact region 9 are electrically coupled to each wiring of the wiring layer by contact holes opened in the interlayer insulation layer. FIG. 3 shows that the OD contact region 11 is coupled to the wiring 51. In addition, each wiring is made of metal material, such as aluminum.

In the present embodiment, a provision is made to control the potential barriers of the transfer channel RT and the unwanted electric charge discharging channel RL by independently controlling the transfer transistor TT and the LOD transistor TL. When describing the ups and downs (rising and lowering) of the potential of these channels, RT and RL, with reference to the hole potential, in the accumulating period, the potentials of the transfer channel RT and the unwanted electric charge discharging channel RL are set high enough to allow photo-generated electric charges (in case of hole) to be accumulated, while the potential of the unwanted electric charge discharging channel RL is set lower than the potential of the transfer channel RT. In addition, hereinafter, the ups and downs of the potential will be described with reference to the hole potential, not to the electron potential.

Effect

The accumulating period and the blanking period can be carried out in the same time period by using the sensor cell constituted this way.

Comparison with Conventional Example

In the device of the above mentioned Japanese Unexamined Patent Publication No. 2002-134729, under the photo-diode formation region and the ring gate of the modulation transistor, a first and a second P type well region are integrally formed in a planar shape which approximately equals the opening region of the photo diode and the ring gate. Then, photo-generated electric charges generated by incident light from the opening region of the photo-diode are transferred from the first well region to the second well region under the ring gate, and are accumulated in the carrier pocket with a low potential (with reference to the hole potential) formed in this portion.

In such a device of Japanese Unexamined Patent Publication No. 2002-134729, the accumulation and the reading can also be carried out with shifting, within one frame period, the line to be initialized using a focal-plane shutter. However, in this case, each cell has a different timing for the accumulating period for each line, and the sampling timing of an image will deviate in the vertical direction. Therefore, if an object to be imaged moves, image distortion arises due to the sampling timing offset in the vertical direction of the image. Especially, where there are many lines provided as with a high resolution requirement, the time deviation will increase between upper and lower lines and the distortion will be outstanding.

Then, in Japanese Unexamined Patent Publication No. 2002-134729, the accumulating period of all the cells is set to a common period. Namely, during the accumulating period, the potential barrier between the first well region and the second well region integrally formed is lowered by the transfer gate. Accordingly, the photo-generated electric charges are transferred from the first well region to the second well region, and continue to be accumulated in the carrier pocket. Upon completion of the accumulating period, the pixel signal corresponding to the electric charges in the carrier pocket will be outputted in the reading period. In the device of Japanese Unexamined Patent Publication No. 2002-134729, in this reading period, a provision is made to discharge the photo-generated electric charges generated in the light-receiving region to the substrate through the overflow-drain region, thereby enabling the accumulation of only effective photo-generated electric charges in the accumulating period.

On the other hand, in the present embodiment, the accumulating period and the reading period are set to a common period. Namely, during the accumulating period, the potential barrier of the transfer channel RT and the unwanted electric charge discharging channel RL is set to a potential high enough by independently controlling the transfer transistor TT and the LOD transistor TL. Moreover, the potential of the unwanted electric charge discharging channel RL is set lower than the potential of the transfer channel RT during the period other than the transfer period, which will be described later, for example, during the accumulating period. Accordingly, in the accumulating period, the transfer of the electric charges between the modulation well 5 and the accumulation well 4 can be prevented, and the photo-generated electric charges can be accumulated in the accumulation well 4.

Thus, during the period before reading based on the photo-generated electric charges which are transferred to the modulation well 5 and stored is completed, even within the accumulating period, the amount of the photo-generated electric charges being stored can be made constant. Therefore, even in the accumulating period, the reading of the pixel signal based on the electric charges stored in the modulation well 5 can be carried out.

Moreover, during the accumulating period, the accumulation well 4 is surrounded, in terms of potential, by the transfer transistor TT and the LOD transistor TL having a sufficiently high potential barrier, the accumulation can be carried out even in the reading period of the modulation well 5. Furthermore, even when the potential based on the photo-generated electric charges increases remarkably such as when an extremely strong light enters, the photo-generated electric charges flow to the OD contact region 11 side, not to the modulation well 5 side, and will not have an adverse influence on the reading.

Moreover, in the device of Japanese Unexamined Patent Publication No. 2002-134729, neither a higher quality image nor miniaturization have been achieved satisfactorily due to the fact that the overflow-drain region used for the discharging channel at the first well region side needs to be constituted with a deep P layer extending from the substrate to the substrate surface.

On the other hand, in the present embodiment, unwanted electric charges including the electric charges that overflow in the accumulation well 4 are transferred in the horizontal direction, and thereafter are discharged from the OD contact region 11 through the wiring 51 on the substrate 1. Therefore, it is not necessary to form a deep over-drain region extending from the substrate 1a to the substrate 1 surface, and both a higher quality image and miniaturization can be achieved satisfactorily.

Circuit Configuration of the Entire Device

Next, the circuit configuration of the entire solid state imaging device according to the present embodiment will be described with reference to FIG. 4.

A solid state imaging device 61 has a sensor cell array 62 including the sensor cell 3 of FIG. 1 through FIG. 3, and circuits 64, 65, 67 through 70 which drive each sensor cell 3 in the sensor cell array 62. The sensor cell array 62 is constituted arranging the cell 3 in a matrix form. The sensor cell array 62 includes such as the cell 3 of 640×480, and a region (OB region) for the optical black (OB). When the OB region is included, the sensor cell array 62 is composed of cells 3 of 712×500 or the like.

Equivalent Circuit of Sensor Cell

Figure 5A:
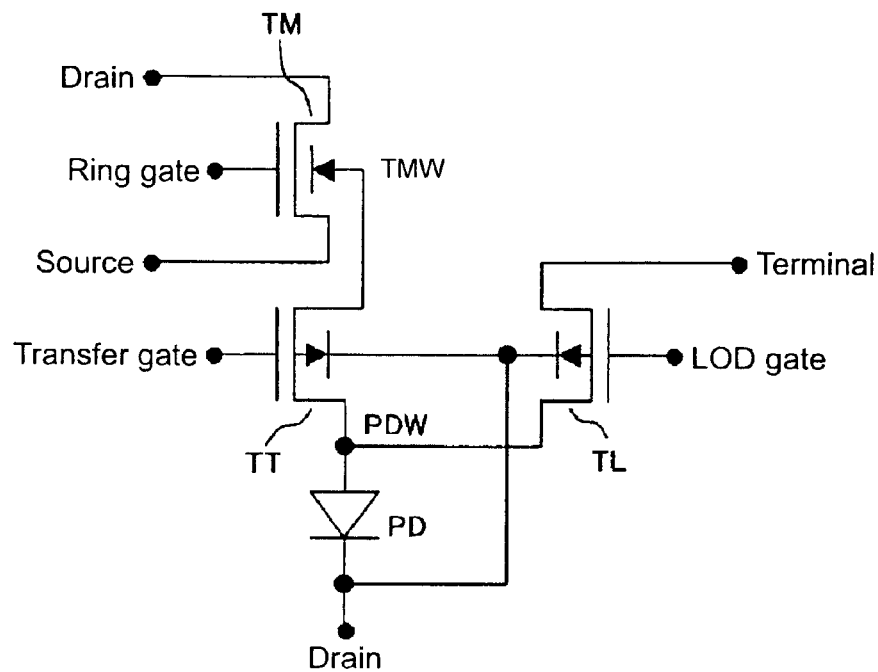
FIGS. 5A and 5B are equivalent circuit diagrams of a sensor cell.
Figure 5B:
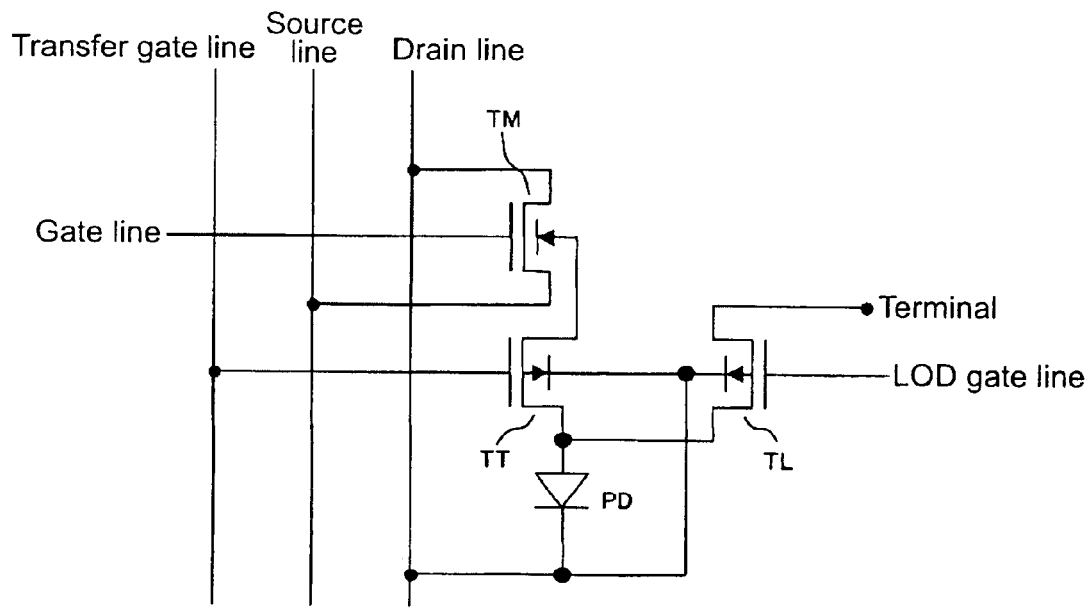
Figure 6:
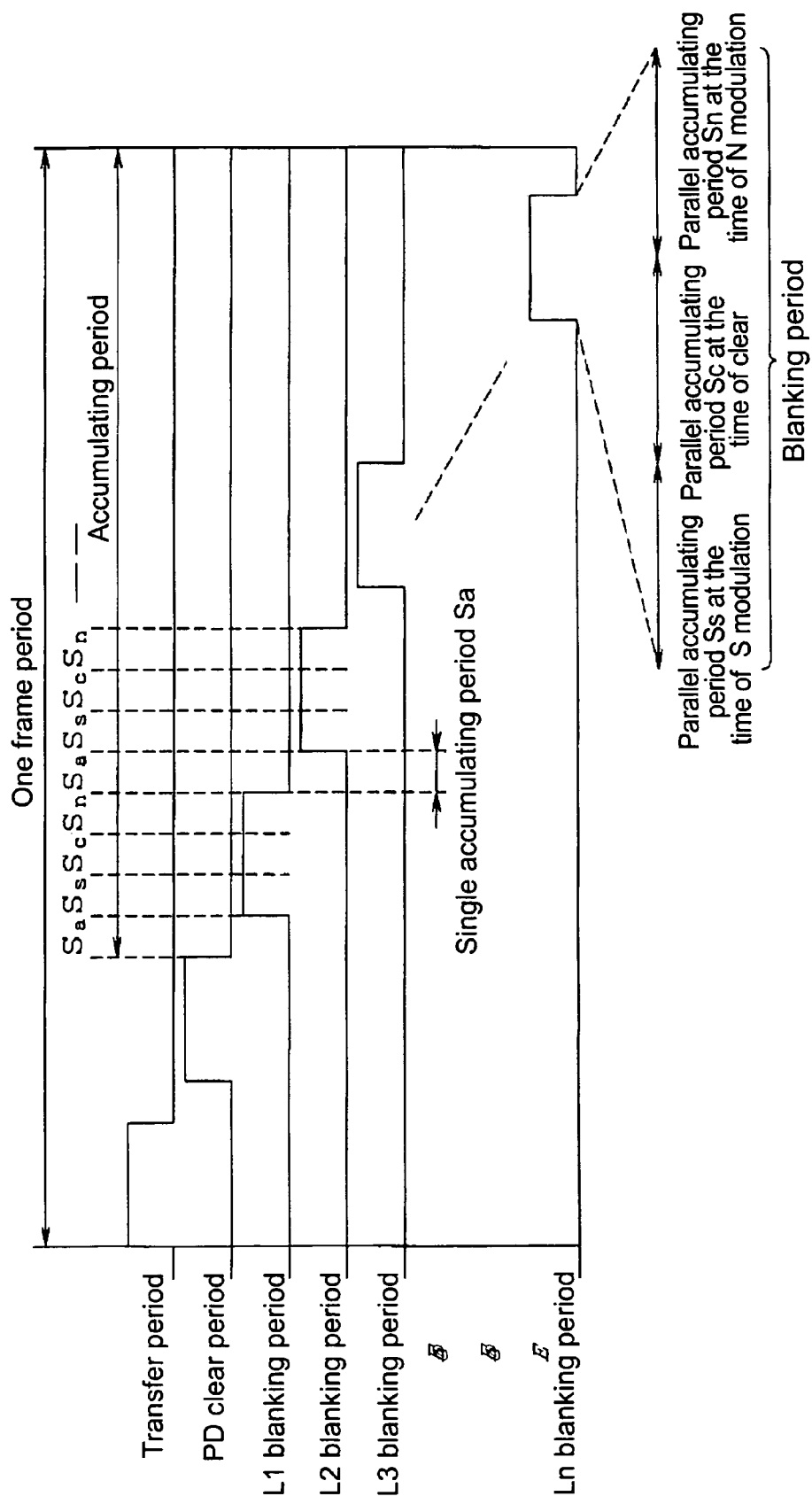
FIG. 6 is a timing chart illustrating the outline of each driving period in the first embodiment.

FIG. 5 shows the specific circuit configuration of each sensor cell in FIG. 4. FIG. 5(A) shows an equivalent circuit of the sensor cell, and FIG. 5(B) shows coupling between the sensor cell and each signal line.

Each sensor cell 3 includes the photo-diode PD which performs photoelectric conversion, the modulation transistor TM for detecting the optical signal for reading, and the transfer transistor TT which controls transfer of photo-generated electric charges. The photo diode PD generates the electric charges (photo-generated electric charges) corresponding to incident light, and accumulates the generated electric charges to the accumulation well 4 (corresponding to a coupling point PDW in FIG. 5(A)). The transfer transistor TT transfers the photo-generated electric charges accumulated in the accumulation well 4 in the accumulating period to the carrier pocket 10 in the modulation well 5 (corresponding to a coupling point TMW in FIG. 5(A)) used for the threshold modulation of the modulation transistor TM in the transfer period, and stores.

With respect to the modulation transistor TM, that the photo-generated electric charges are stored in the carrier pocket 10 is equivalent to that the back gate bias thereof is changed, and the threshold voltage of the channel changes corresponding to the amount of the electric charges in the carrier pocket 10. Accordingly, the source voltage of the modulation transistor TM becomes the one corresponding to the electric charges in the carrier pocket 10, i.e., the brightness of the incident light upon the photo diode PD.

Between the accumulation well 4 and the terminal, the LOD transistor TL as the unwanted electric charge discharging control element is arranged. The LOD transistor TL controls the potential barrier between the accumulation well 4 and the terminal, and discharges the unwanted electric charges in the accumulation well 4 to the terminal.

Thus, each cell 3 exhibits the above mentioned operations of the accumulation, the transfer, the reading, or the like by applying a driving signal to the ring gate 6 of the modulation transistor TM, the source and the drain, the transfer gate 13 of the transfer transistor TT, and the LOD gate 12 of the LOD transistor TL. As shown in FIG. 4, a signal is provided to each part of the cell 3 from vertical drive scanning circuits 64 and 65, a drain driving circuit 67, and a transfer driving circuit 68.

FIG. 5(B) shows the coupling to each of the scanning circuits 64 and 65, each of the driving circuits 67 and 68, and the signal output circuit 69, for one of the cell 3 arranged in a matrix form. The coupling condition of other cells is the same. Each cell 3 is provided corresponding to the intersection of a plurality of source lines horizontally arranged and a plurality of gate lines vertically arranged with respect to the sensor cell array 62. In each cell 3 of each line arranged in the horizontal direction, the ring gate 6 of the modulation transistor TM is coupled to a common gate line, and in each cell 3 of each row arranged in the vertical direction, the source of the modulation transistor TM is coupled to a common source line.

By providing an ON signal to one of the plurality of gate lines, each cell commonly coupled to the gate line to which the ON signal is provided is simultaneously selected, and the pixel signal is outputted through each source line from each source of these selected cells. The vertical drive scanning circuit 64 provides an ON signal to the gate line by sequentially shifting in one frame period. The pixel signal from each cell of the line to which the ON signal is provided is simultaneously read from the source line by one line portion, and is provided to the signal output circuit 69. The pixel signal for one line portion is sequentially outputted (line-out) for every pixel from the signal output circuit 69 by the horizontal drive scanning circuit 70.

In the present embodiment, as described above, the accumulation well 4 and the modulation well 5 are formed, with being independently separated in terms of the potential, and the transfer transistor TT which controls the potential barrier between the accumulation well 4 and the modulation well 5 is provided. Thus, accumulation of the photo-generated electric charges by the photo diode PD and the reading of the pixel signal by the modulation transistor TM are carried out simultaneously. Control of the transfer transistor TT is carried out by providing a gate signal to the transfer gate 13 of each transfer transistor TT from the transfer driving circuit 68.

Moreover, in the present embodiment, as described above, by providing the LOD transistor TL which controls the potential barrier of the unwanted electric charge discharging channel RL of the accumulation well 4, the discharge of the unwanted electric charges from the accumulation well 4 can be securely carried out in terms of the potential. Control of the LOD transistor TL is carried out by providing the gate signal to each LOD gate 12 from the vertical drive scanning circuit 65. In addition, the drain driving circuit 67 provides a drain voltage to the drain of each modulation transistor TM.

Relationship Between Accumulating Period and Reading period

FIG. 6 is a timing chart for illustrating each driving period in the present embodiment. In addition, FIG. 6 shows the driving sequence in the normal mode as will be described later. In FIG. 6, L1, L2 and so on correspond to each line of the sensor cell array 62.

The accumulating period is set to a period common to all the cells, as will be described later. However, the reading is carried out for each line. The reading timing differs for each line, and the reading period (blanking period) for each line is shown as a pulse shape in FIG. 6. Hereinafter, the line where the reading is carried out is referred to as a reading line, and each cell of the reading line is referred to as the reading cell. Moreover, lines other than the reading line are referred to as non-reading lines, and each cell for non-reading lines is called a non-reading cell.

Reading Period

The reading period (blanking period) comprises an S (signal) modulation period, a clear period, and an N (noise) modulation period in the present embodiment. A signal component and a noise component are read from the same cell to compare and remove the variation between cells 3 and various kinds of noises. During the S modulation period, an S modulation operation for reading the pixel signal based on the photo-generated electric charges accumulated in the modulation well 5 is carried out. During the clear period, a clear operation for discharging the photo-generated electric charges remaining in the modulation well 5 through the residual electric charges discharging channel RC is carried out in order to read the noise component. During the N modulation period, in order to read the noise component from the modulation well 5, N modulation operation, which reads the pixel signal after the clear, is carried out.

Accumulating Period

In the present embodiment, a provision is made to carry out the accumulation operation (parallel accumulation operation) to the accumulation well 4 even in the blanking period. Namely, the S modulation period, the clear period, and the N modulation period during the blanking period each are, in terms of the accumulation, a parallel accumulating period Ss at the time of the S modulation, the parallel accumulating period Sc at the time of the clear, and a parallel accumulating period Sn at the time of the N modulation.

The accumulating period according to the present embodiment includes, besides a parallel accumulating period which is the same period as the blanking period, a single accumulating period Sa where a single accumulation operation is carried out. The pixel signal read in the blanking period is stored in a line memory (corresponding to the signal output circuit 69 of FIG. 4). The pixel signal for one line portion is sequentially outputted per pixel from this line memory, and the reading from each cell of the following line is carried out after the output of the line memory is completed. Therefore, the reading from the cell of the following line cannot be carried out until the output from the line memory is completed, and thus the single accumulating period Sa is set to a period required to transfer and output (line-out) the pixel signal from such a line memory.

Sequence in Frame

In the present embodiment, for example, as shown in FIG. 6, one frame period is constituted by cyclically repeating the single accumulating period Sa and the parallel accumulating periods Ss, Sc, and Sn, after the transfer period and the PD clear period, as will be described later. All the cells 3 of the sensor cell array 62 cyclically repeat operation of the single accumulating period Sa and the parallel accumulating periods Ss, Sc, and Sn. Then, only the period shown in the pulse shape of FIG. 6 among the parallel accumulating periods Ss, Sc, and Sn is set in the blanking period for each line (as becoming the reading cell), and the reading operation is carried out. In one frame period, the single accumulating period Sa and the blanking period are repeated a number of times based on the number of lines.

In the single accumulating period Sa and the parallel accumulating periods Ss, Sc, and Sn, the photo-generated electric charges are successively accumulated in the accumulation well 4, as will be described later. As shown in FIG. 6, the time period from completion of the PD clear period to the completion of a frame period is the accumulating period, during which the photo-generated electric charges accumulated in the accumulation well 4 will be transferred from the accumulation well 4 to the modulation well 5 in the transfer period, which is the leading period of the following frame, shown in FIG. 6, and are stored. During the transfer period, all the cells perform the transfer operation as will be described later.

Next, the PD clear period, which is very short, is set up in order to discharge the photo-generated electric charges generated from the completion of the transfer period before the start of the accumulating period. In the PD clear period, unwanted electric charges are discharged from the accumulation well 4 of all the cells. In addition, the PD clear period is used for setting up the length of the accumulating period, and the PD clear period can be omitted in the normal mode.

Looking at a predetermined line, for example, in each cell in a line L1 as the reading cell at the modulation transistor TM side, during the blanking period as shown in FIG. 6, the S modulation operation, the clear operation, and the N modulation operation are carried out. At the same time, at the accumulation well 4 side, the parallel accumulation operation Ss at the time of the S modulation, the parallel accumulation operation Sc at the time of the clear, and the parallel accumulation operation Sn at the time of the N modulation are carried out. During the period other than this blanking period, as for the non-reading cell, the single accumulation operation Sa, the parallel accumulation operation Ss at the time of the S modulation, the parallel accumulation operation Sc at the time of the clear, and the parallel accumulation operation Sn at the time of the N modulation are cyclically repeated.

Namely, in any cell, all the periods except for the transfer period and the PD clear period are set as the single or the parallel accumulating period, and the parallel accumulation operation is also carried out especially during the blanking period of the reading cell. Then, the accumulated photo-generated electric charges are transferred to the modulation well 5 in the transfer period at the beginning of the following frame. Namely, the period from the completion of PD clear period (the completion of the transfer period in case that the PD clear period is omitted) of the preceding frame to the start of the transfer period is the accumulating period for each cell, and the pixel signal used for blanking is based on the photo-generated electric charges accumulated in the accumulating period of the preceding frame.

Potential

Next, with reference to FIG. 7 and FIG. 8, operation in the single accumulating period Sa, the transfer period, the S modulation period (parallel accumulating period Ss), the clear period (parallel accumulating period Sc), and the N modulation period (parallel accumulating period Sn) and PD clear period will be described based on the potential relationship. FIG. 7 is a diagram illustrating the potential relationship for each period, with the direction, where the hole potential becomes high, being the positive side. FIG. 7(A) shows the condition at the time of the single accumulation, FIG. 7(B) shows the condition at the time of the transfer, FIG. 7(C) shows the condition at the time of the S modulation or the N modulation (S/N modulation), FIG. 7(D) shows the condition at the time of the clear and FIG. 7(E) shows the condition at the time of the clear (PD clear) of the accumulation well 4 in a high-speed shutter mode. The column on the left side of FIG. 7 shows the condition of the reading cell, and the column of the right side shows the condition of the non-reading cell. In addition, FIG. 7 shows the potential changes based on the electric charges, with a satin pattern. Moreover, as described above, whether each cell becomes either the reading cell or the non-reading cell is indicated by the pulse of FIG. 6.

FIG. 7 shows the potential relationship for each position, taking the position corresponding to the cutting line of each cell of FIG. 2 in the horizontal axis, and taking the potential with reference to the hole in the vertical axis. From the left side to the right side in FIG. 7, the potentials in the substrate at the positions of one end side of the carrier pocket (PKT) 10, the source (S), the other end side of the carrier pocket (PKT) 10, the transfer gate (TX) 13 (transfer channel RT portion), the accumulation well region (PD), the LOD gate (LOD) 12 (unwanted electric charge discharging channels RL portion) and the OD contact region (Sub) are shown.

Moreover, FIG. 8 shows changes of the driving voltage for each period. In FIG. 8, the dashed lines show changes of the driving voltage of a select line. FIG. 8 shows the changes of the driving voltage for each period, and the actual driving sequence and the order of the period to set differ. FIG. 8 shows a setup of the driving voltage shown in FIG. 7 in time order. In addition, as for the blanking period, in FIG. 8, the driving voltage of the reading cell is shown with the dashed line and the driving voltage of the non-reading cell is shown with the solid line.

The potential of each part changes corresponding to the driving voltage. For example, if the source voltage and the drain voltage or the like are increased or decreased, the potential of the surroundings will increase or decrease as well. For example, the potential of the accumulation well 4 is influenced mainly by both the applied voltages to the source and to the drain of the modulation transistor TM. Moreover, the potential of the modulation well 5 will be increased or decreased mainly corresponding to the ups and downs of the gate voltage of the modulation transistor TM.

In the present embodiment, the same drive is carried out to all the cells in the single accumulating period Sa shown in FIG. 7(A). As also shown in FIG. 8, in the single accumulating period Sa shown in FIG. 7(A), 0.0V is applied to the ring gate (RG) 6, 2.5V is applied to the transfer gate (TX) 13, 2.0V is applied to the LOD gate 12, 1.0V is applied to the drain D, and 1.0V is applied to the source. The drain voltage is set to a relatively low value.

In the single accumulating period, the potential barrier of the transfer channel RT between the accumulation well 4 and the modulation well 5 is made high enough by the transfer transistor TT. Moreover, the potential barrier of the unwanted electric charge discharging channel RL between the accumulation well 4 and the OD contact region 11 is made high enough by the LOD transistor TL. Furthermore, the potential of the potential barrier of the transfer channel RT is made higher than the potential of the potential barrier of the unwanted electric charge discharging channel RL. The accumulation well 4 is set at a relatively high concentration, and its potential before the accumulation of the electric charges is relatively low. When the accumulation is started, the electric charges are generated by light entered from the opening region 2 of the photo diode PD, and are accumulated in the accumulation well 4. FIG. 7(A) shows the potential increase by the accumulation of the electric charges, with a satin pattern.

In the present embodiment, the potential barrier of the unwanted electric charge discharging channel RL and the potential barrier of the transfer channel RT are sufficiently high (potential is high), and the electric charges generated by incident light are accumulated in the accumulation well 4, without being transferred to the modulation well 5. Since the potential barrier of the transfer channel RT is higher than the potential barrier of the unwanted electric charge discharging channel RL, even if extremely strong light enters, the electric charges which overflow from the accumulation well 4 are discharged to the OD contact region 11 through the unwanted electric charge discharging channel RL, and will not flow into the modulation well 5.

In the transfer period shown in FIG. 7(B), 0.0V is applied to the ring gate (RG) 6, 0.0V is applied to the transfer gate (TX) 13, 2.0V is applied to the LOD gate 12, 4.0V is applied to the drain D, and 0.0V is applied to the source.

0V is applied to the transfer gate 13, the potential barrier of the transfer channel RT becomes low enough. Accordingly, the electric charges accumulated in the accumulation well 4 in the single accumulating period Sa described above and in the parallel accumulating periods Sa, Sc, and Ss, as will be described later, flow into the modulation well 5 through the transfer channel RT. In addition, by setting the drain voltage to a relatively high voltage, the potential gradient is increased and thus the transfer of the electric charges is made easy. Moreover, also in the transfer period shown in FIG. 7(B), all the cells become the reading cells, and the same drive is carried out.

The reading period includes the signal modulation (S modulation) period for mainly reading the signal component (S), the noise modulation (N modulation) period for mainly reading the noise component (N), and the clear period for clearing the residual electric charges in order to read the noise component. By reading the signal component and the noise component to compare, the image signal, in which the cell variation and the various kinds of noises are removed, is obtained. Namely, in the reading period, the S modulation period, the clear period, and the N modulation period are carried out in this order.

The same control is carried out in the S modulation period and the N modulation period. In the S/N modulation period shown in FIG. 7 (C), with respect to the reading cell, as shown in the dashed line of FIG. 8, 2.5V is applied to the ring gate (RG) 6, 2.5V is applied to the transfer gate (TX) 13, 2.0V is applied to the LOD gate 12, and 2.5V is applied to the drain D. Vg–Vths (=2.5–Vths) arises at the source (Vg is the gate voltage and Vths is the threshold voltage of the channel at the time of the S modulation).

The reading is carried out for each line. Only each cell of one line (reading line) out of all the lines becomes a reading cell, and each cell of other lines (non-reading lines) is a non-reading cell. Then, upon completion of the reading of each reading cell from the reading line, the reading line shifts, and each cell of the following line becomes a reading cell, and other cells become the non-reading cells. Similarly, the reading (S modulation) of the signal component or the reading (N modulation) of the noise component is carried out by shifting the reading line.

As for the reading cell, the potential barrier of the transfer channel RT is made high by the transfer transistor TT so that the electric charges stored in the modulation well 5 may not flow into the accumulation well 4. Since the voltage of the ring gate 6 is made high, the source potential increases accordingly. The threshold voltage of the channel of the modulation transistor TM changes corresponding to the electric charges stored in the carrier pocket 10. Namely, the source potential of the modulation transistor TM becomes the one corresponding to the generated amount of the photo-generated electric charges, i.e., the incident light, because the photo-generated electric charges accumulated in the accumulation well 4 of the photo diode PD are transferred to the carrier pocket 10.

In addition, as for the non-reading cell, as shown in the solid line of FIG. 8, 0.0V is applied to the ring gate (RG) 6, 2.5V is applied to the transfer gate (TX) 13, 2.0V is applied to the LOD gate 12, and 2.5V is applied to the drain D. Also in this case, Vg–Vths (=0–Vths) arises in the source, however, since the voltage of the ring gate 6 is low, the output of the non-reading cell becomes a level sufficiently lower than the output of the reading cell. Therefore, only the output pixel signal of the reading cell appears at the source line.

In addition, since the potential difference applied to the ring gate 6 of the reading cell and of the non-reading cell is made high enough, even if, for example, the image is dark or the like, the output pixel signal of the reading cell can be taken out from the source line securely.

In the clear period shown in FIG. 7(D), as for the reading cell, as shown in the dashed line of FIG. 8, 7.0V is applied to the ring gate (RG) 6, 2.5V is applied to the transfer gate (TX) 13, 2.0V is applied to the LOD gate 12, 5.0V is applied to the drain D, and 5.0V is applied to the source.

By applying a sufficiently high voltage to the ring gate (RG) 6, the drain D, and the source, the potential of the modulation well 5 is made high enough, and the residual electric charges are discharged to the substrate 1a through the N layer 21' under the modulation well 5. Accordingly, the photo-generated electric charges in the modulation well 5 are removed, thereby enabling the reading (noise modulation) of the noise component.

On the other hand, as for the non-reading cell, as shown in the solid line of FIG. 8, 0.0V is applied to the ring gate (RG) 6, 2.5V is applied to the transfer gate (TX) 13, 2.0V is applied to the LOD gate 12, 5.0V is applied to the drain D, and 5.0V is applied to the source. Since the ring gate (RG) 6 is set to a low voltage, the photo-generated electric charges accumulated in the modulation well 5 are not discharged.

The reading of the non-reading cell out of the cells per line has already been completed after the blanking period passed in FIG. 6, however, as for the non-reading cells of the line before the blanking period passes, the reading has not been carried out yet. Then, in the non-reading cells, the electric charges are prevented from being discharged from the modulation well 5. The satin-pattern portion with respect to the non-reading cell of FIG. 7(C) and (D) indicates that the electric charges, which has not been read, is stored in the modulation well 5.

According to the present embodiment, as described above, the parallel accumulation operation is carried out in the S/N modulation period and the clear period. FIG. 7(C) and (D) show this parallel accumulation operation. Namely, in the reading period (S/N modulation and clear period), the photo-generated electric charges are accumulated in the accumulation well 4 by increasing the potential barrier of the transfer channel RT and the unwanted electric charge discharging channel RL. Accordingly, the reading period (modulation period and clear period) of the modulation transistor TM will be the accumulating period (parallel accumulating periods Ss, Sn, and Sc) for accumulating the photo-generated electric charges at the photo diode PD side. In addition, in the parallel accumulating period Ss and Sn of FIG. 7(C), and the parallel accumulating period Sc of FIG. 7(D), the drain voltage is higher as compared with the single accumulating period Sa, and thus the conditions of accumulating the photo-generated electric charges differ. Moreover, as shown in FIG. 7(C) and (D), the conditions of accumulating the photo-generated electric charges differ slightly between the reading cell and the non-reading cell.

Thus, in the single accumulating period Sa, the S/N modulation period, and the clear period, accumulation of the photo-generated electric charges are carried out in all the cells, and the accumulation time for each cell will be approximately one frame period as shown in FIG. 6. In this manner, a provision is made to separately constitute the accumulation well 4 for accumulating the electric charges which is formed at the photo diode PD side, and the modulation well 5 which is formed at the modulation transistor TM side, and to control the potential barrier of the transfer channel RT between both by the transfer transistor TT. Accordingly, the accumulation well 4 and the modulation well 5 can be set in the reading period and the parallel accumulating period of the same period, and thus the frame rate can be increased.

The PD clear period which is an initialization period shown in FIG. 7(E) is adopted in the high-speed shutter mode or in the low-speed shutter mode described later. As shown in FIG. 8, 0.0V is applied to the ring gate (RG) 6, 2.5V is applied to the transfer gate (TX) 13, 0.0V is applied to the LOD gate 12, 4.0V is applied to the drain D, and the source impedance is made high. In addition, the driving voltage when PD clear period is used in the normal mode is also the same as that of FIG. 7(E).

The potential barrier of the unwanted electric charge discharging channel RL is made low enough by lowering the voltage applied to the LOD gate, and the unwanted electric charges accumulated in the accumulation well 4 are discharged from the unwanted electric charge discharging channel RL to an external signal line through the OD contact region 11. In addition, when PD clear operation is adopted in a normal mode as shown in FIG. 6, the residual electric charges will not be left in the modulation well 5 portion of FIG. 7(E).

Driving Sequence

Next, the operation sequence regarding each mode of the normal mode, the high-speed shutter mode and the low-speed shutter mode will be described.

Figure 10A:
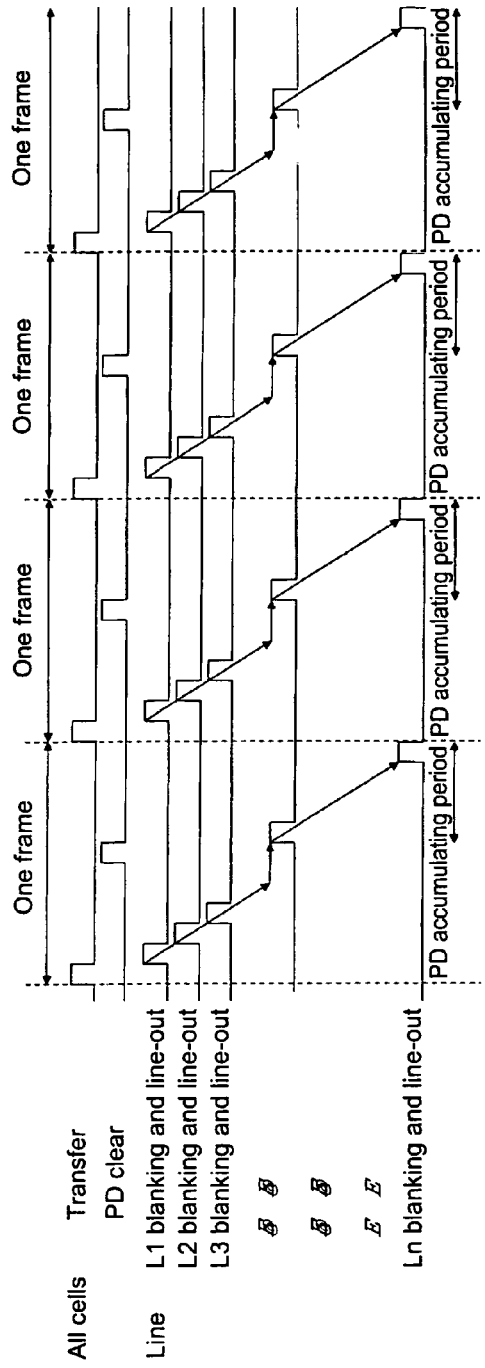
FIGS. 10A-B are timings chart showing a driving sequence.
Figure 10B:
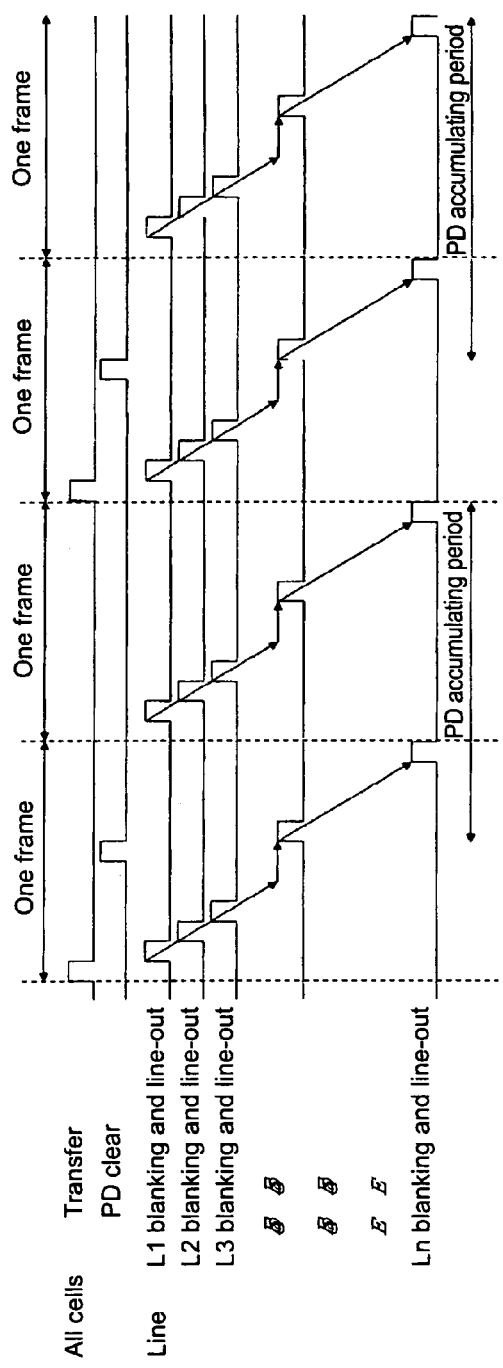

FIGS. 9 and 10 are timing charts showing the driving sequences. FIG. 9 shows the normal mode, FIG. 10(A) shows the high-speed shutter mode, and FIG. 10(B) shows the low-speed shutter mode.

In the normal mode of FIG. 9, the same operation of FIG. 6 as described above is carried out. In addition, the PD clear period is omitted in the normal mode of FIG. 9. Moreover, in FIG. 9 and FIG. 10, the single accumulating period Sa (line-out period) and the blanking period of FIG. 6 are combined to be shown as one pulse shape. In addition, as described above, the single accumulating period Sa is the time required for transferring data from the line memory, and actually needs more time than the blanking period.

In the normal mode of FIG. 9, each cell has an accumulating period of one frame period except for the transfer period, and the reading from all the cells completes in one frame period. Since the parallel accumulating period is set up using time common to the blanking period, it is not necessary to prepare another period for the accumulation, and thereby the frame rate can be increased.

FIG. 10(A) shows the driving sequence in the high-speed shutter mode.

The high-speed shutter mode is used, for example, for shortening the accumulating period. In addition, in the conventional examples, since provision is made to discharge the residual electric charges of the first well upon completion of the blanking, the high-speed shutter mode or the like according to the present embodiment cannot be implemented.

For example, when extremely bright light is incident upon the photo diode PD, the amount of the electric charges which flows into the modulation well 5 of each cell increases extremely, and the image based on the pixel signal read from each cell will be whitish (bright) as a whole and the contrast thereof will degrade. In such a case, the high-speed shutter mode is adopted. In the high-speed shutter mode, as shown in FIG. 10(A), the PD clear period is set to an arbitrary position in one frame period. As described above, the accumulating period is a period from the completion of the PD clear in the preceding frame to the starting time of the transfer period.

As shown in FIG. 7(E), in the PD clear period, the electric charges accumulated in the accumulation well 4 are discharged to the outside through the OD contact region 11. Accordingly, the photo-generated electric charges generated after the completion of PD clear period are accumulated in the accumulation well 4. After the completion of the PD clear period, the single accumulating period Sa and the parallel accumulating periods Ss, Sc, and Sn are cyclically repeated until the completion of the frame period. Thus, after the accumulation is carried out only for the time shorter than the one frame period corresponding to the position of the PD clear period, the photo-generated electric charges accumulated in the accumulation well 4 are transferred to the modulation well 5 in the transfer period at the beginning of the frame.

The reading is the same as that of the normal mode, and while the reading line is sequentially shifting, the reading of all lines completes in one frame period. In addition, as for the cell where the reading has not been completed, as shown in FIG. 7(E), the electric charges are being stored in the modulation well 5, and can be read in one frame period regardless of the accumulating period based on the position of the PD clear period.

For example, in case that the PD clear period is set to the approximate center of one frame period, the accumulating period will be about a half of one frame period, and the amount of the electric charges which flow into the modulation well 5 will be about a half of that of the normal mode, and the brightness of the image based on the pixel signal read from each cell can be made adequate. Thereby, an image having sufficient contrast, though it is bright, can be obtained.

In addition, since the PD clear period can be easily set up by applying the driving voltage shown in FIG. 8 to each part, the PD clear period can be arranged in an arbitrary position corresponding to the brightness of the image. Therefore, the accumulating period can be set up without restraint, and the pixel signal having an optimal level corresponding to the brightness of the image can be obtained from each cell.

FIG. 10(B) shows the driving sequence in the low-speed shutter mode.

The low-speed shutter mode is used, for example, for making the accumulating period longer than one frame period. For example, when light incident upon the photo diode PD is dark, the amount of the electric charges which flow into the modulation well 5 of each cell will decrease, and the image based on the pixel signal read from each cell will be dark as a whole. In such a case, the low-speed shutter mode is adopted. In the low-speed shutter mode, while the PD clear period is inserted once per a plurality of frame periods, the transfer period is inserted once per a plurality of frame periods.

In an example of FIG. 10(B), the PD clear period is inserted once per two frame periods, and the transfer period is set at the leading timing of the frame of one and half frame periods after the completion of this PD clear period. Therefore, the accumulating period in this case will be one and a half frame periods. Thereby, an image having approximately one and a half times brightness as compared with the normal mode can be obtained. In addition, in the case of FIG. 10(B), the reading from each cell will be carried out only once per two frame periods, and the frame rate will be a half of the normal mode.

By adopting the shutter mode of FIGS. 10(A) and (B), the accumulating period can be set up without restraint, and the optimal image corresponding to the brightness of incident light can be obtained.

In addition, also in the low-speed shutter mode, the reading is carried out within approximately one frame period after the transfer period. Conventionally, the accumulated photo-generated electric charges are also discharged by reading, therefore, in the following one frame period after reading, a dummy-reading involving the clear operation which does not contribute to the image signal, cannot be carried out. On the other hand, in the present embodiment, since the reading operation can be carried out simultaneously with the accumulation of the photo-generated electric charges, the dummy-reading involving the clear operation can be carried out even in the following one frame period after reading. Accordingly, there is an advantage that the configuration of the logic circuit for performing the reading operation can be simplified.

EFFECT OF THE EMBODIMENT

Thus, in the present embodiment, the accumulation well 4 for accumulating the photo-generated electric charges is formed in the photoelectric conversion element formation region and the modulation well 5, which is potentially independently separated from the accumulation well 4, is formed in the modulation transistor TM formation region. Then, by providing the transfer transistor TT for controlling the potential barrier between the accumulation well 4 and the modulation well 5 and by allowing the accumulating period and the blanking period to be carried out at the same time, an increase of the frame rate is realized.

In this case, the potential of the unwanted electric charge discharging channel RL is set lower than the potential of the transfer channel RT. Accordingly, in the periods other than the transfer period, the electric charges are not transferred between the modulation well 5 and the accumulation well 4, and even when strong light enters or the like, the photo-generated electric charges which overflow from the accumulation well 4 are allowed to flow to the OD contact region side 11, not to the modulation well 5 side.

Moreover, in the present embodiment, the unwanted electric charges including the electric charges that overflow from the accumulation well 4 are discharged through the external signal line coupled to the contact region 11, and thus it is not necessary to form a deep over-drain region extending from the substrate 1a to the substrate surface, and both a higher quality image and miniaturization can be achieved satisfactorily.

Figure 11:
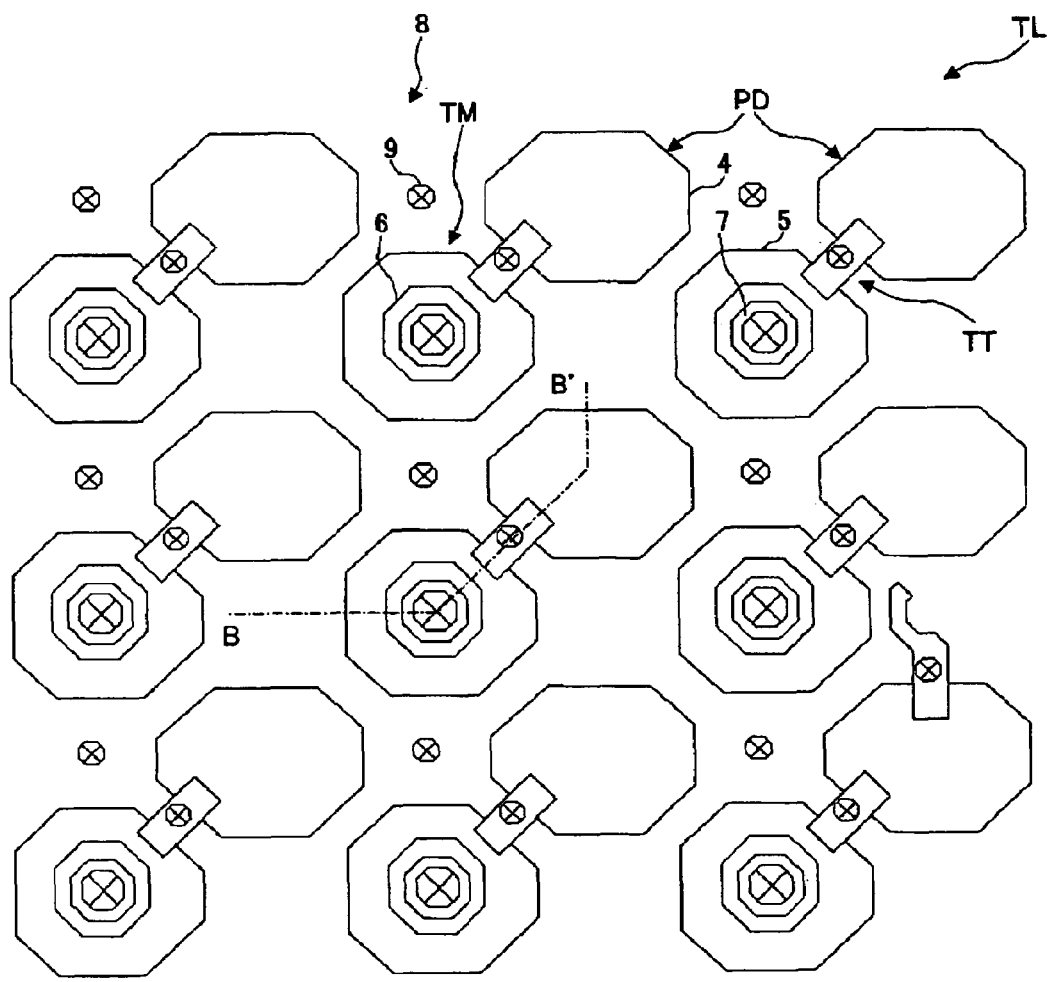
FIG. 11 is a plan view showing a planar shape of a solid state imaging device of a second embodiment.
Figure 12:
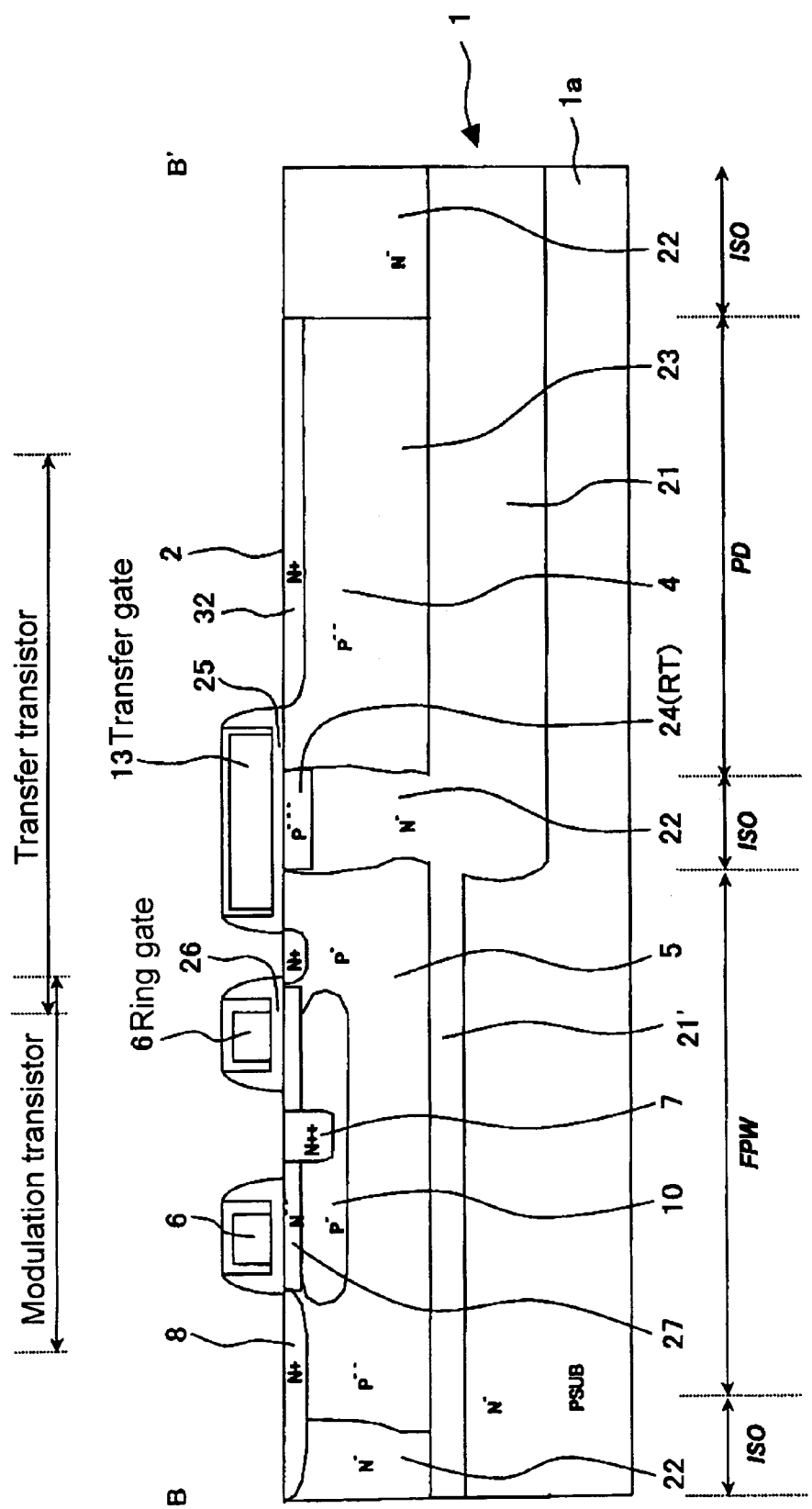
FIG. 12 is a cross-sectional view showing the cross-section cut along the B-B' line of FIG. 11.
Figure 13:
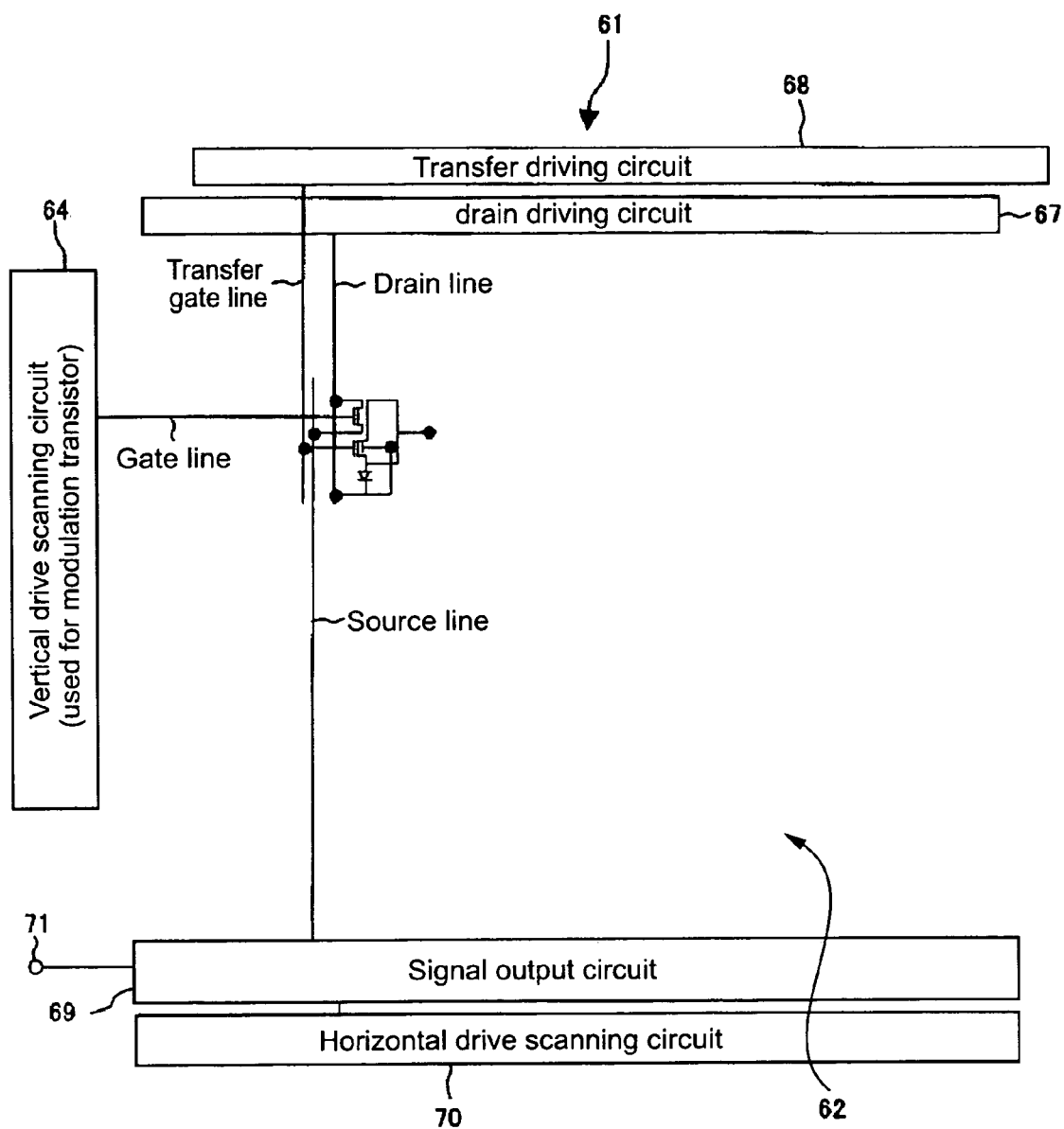
FIG. 13 is a block diagram showing the whole structure of the element of the second embodiment.
Figure 14A:
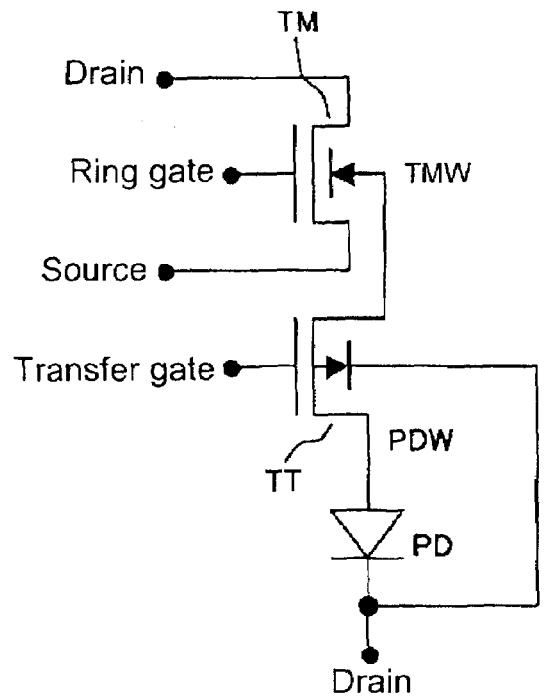
FIGS. 14A-B are equivalent circuit diagrams of the sensor cell of the second embodiment.
Figure 14B:
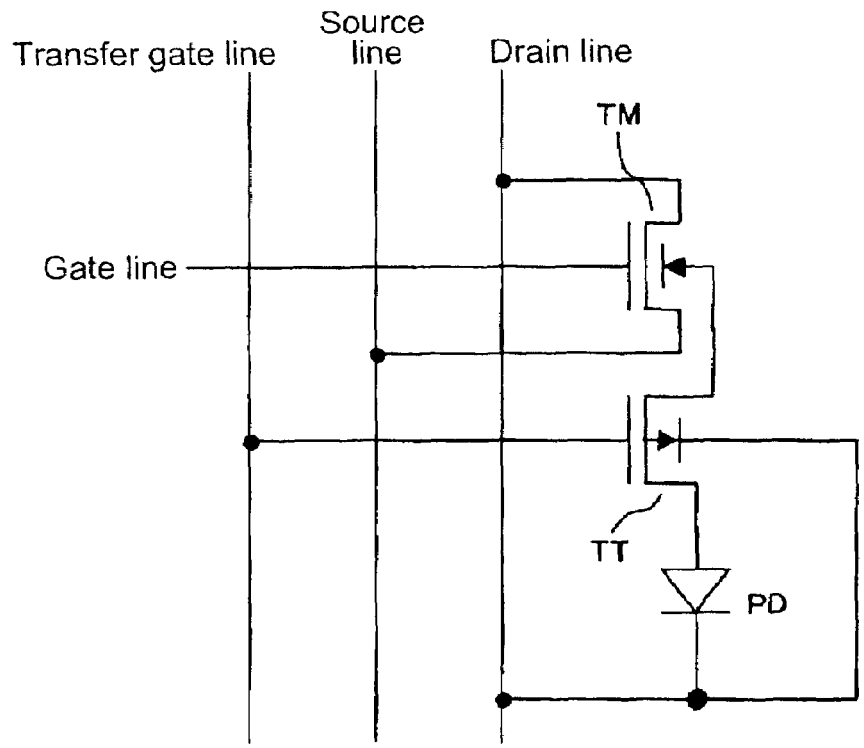
Figure 16:
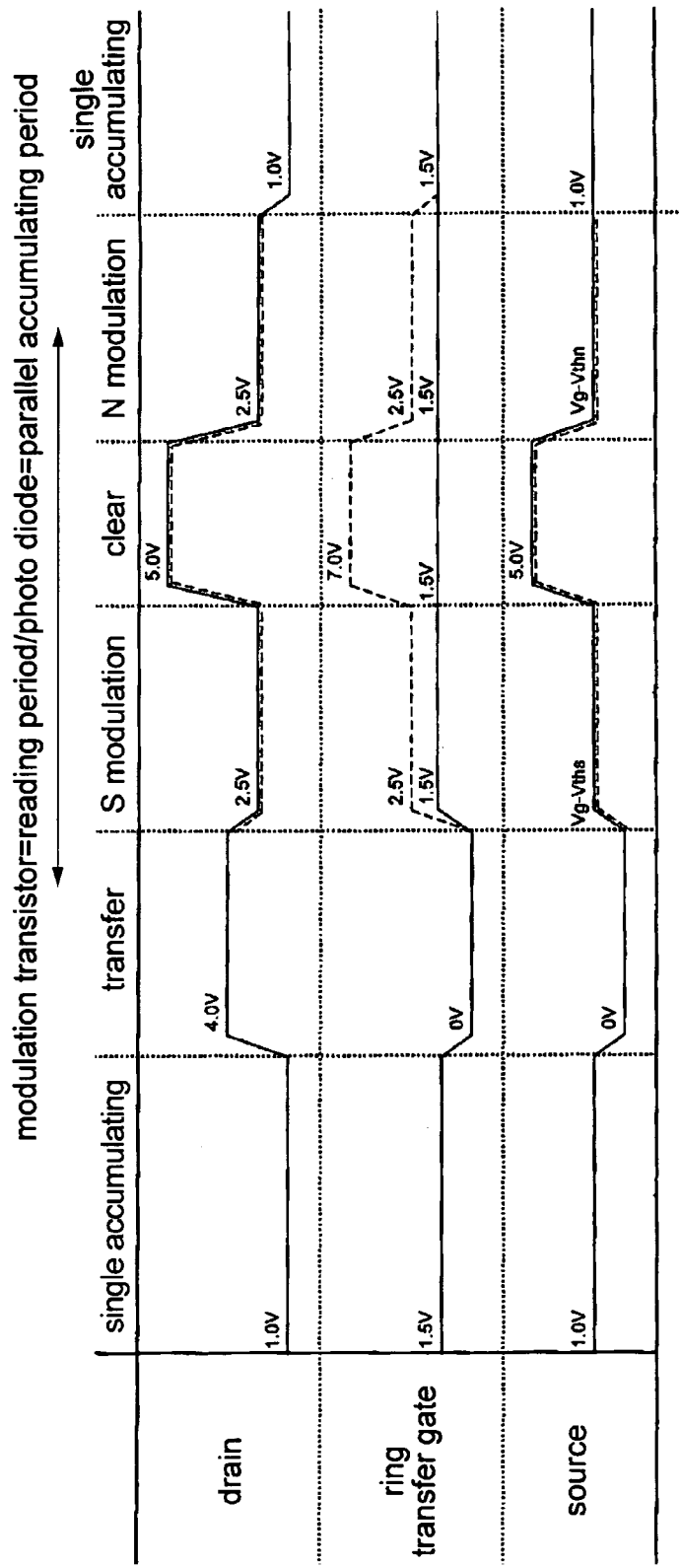
FIG. 16 is a diagram showing changes of the driving voltage in each period in the driving sequence of the second embodiment.

FIG. 11 through FIG. 17 are related to a second embodiment of the present invention, and FIG. 11 is a plan view showing a planar shape of a solid state imaging device of this embodiment, and FIG. 12 is a cross-sectional view showing a cross section cut along the B-B' line of FIG. 11. FIG. 13 is a block diagram showing the entire structure of the element, and FIG. 14 is an equivalent circuit diagram of a sensor cell. FIG. 15 is a diagram showing the potential relationship for the same period of each section, and FIG. 16 is a diagram showing change of the driving voltage for each period in the driving sequence. FIG. 17 is the timing charts showing the driving sequences. In addition, in FIG. 11 through FIG. 17, the same reference numerals are given to the same constitutive elements as those of FIG. 1, FIG. 3 through FIG. 5 and FIG. 7 through FIG. 10, respectively, and the description thereof will be omitted.

In the present embodiment, the only difference from the first embodiment is that the LOD transistor TL, the OD contact region 11, and the unwanted electric charge discharging channel RL are omitted. Namely, as shown in FIG. 11 and FIG. 12, the unwanted electric charge discharging channel RL coupled to the accumulation well 4 of the photo diode PD is not formed, and the LOD transistor TL and the OD contact region 11 are not formed either. Other structure is the same as that of FIG. 1 through FIG. 3.

Even when the sensor cell constituted this way is used, the accumulating period and the blanking period can be carried out in the same period like the first embodiment.

Namely, also in the present embodiment, the electric charges transfer between the modulation well 5 and the accumulation well 4 in the accumulating period can be prevented by controlling the transfer channel RT by the transfer transistor TT, and thus the photo-generated electric charges can be accumulated in the accumulation well 4.

In addition, in the present embodiment, since the PD clear by the LOD transistor TL cannot be carried out, the accumulating period of the accumulation well 4 is determined by the transfer period in which the potential barrier of the transfer channel RT is lowered by the transfer transistor TT. Namely, the period from the completion of the transfer period to the start of the following transfer period is the accumulating period.

Next, the circuit configuration of the whole solid state imaging device according to the present embodiment will be described with reference to FIG. 13. FIG. 14 also shows a specific circuit configuration of each sensor cell in FIG. 13.

In the present embodiment, as shown in FIG. 14, in each cell, the LOD transistor TL is omitted. Therefore, as shown in FIG. 13, the vertical drive scanning circuit 65 for driving the LOD transistor is omitted from the circuit configuration of the whole solid state imaging device.

Also in the present embodiment, the driving sequence is the same as that of FIG. 6 except that the PD clear period is not included. Namely, the accumulating period is set to a period common to all the cells. The reading period (blanking period) includes the S (signal) modulation period, the clear period, and the N (noise) modulation period. Then, also in the present embodiment, the S modulation period, the clear period, and the N modulation period in the blanking period will be, in terms of accumulation, the parallel accumulating period Ss at the time of the S modulation, the parallel accumulating period Sc at the time of the clear, and the parallel accumulating period Sn at the time of the N modulation, respectively. Moreover, the accumulating period includes, besides the parallel accumulating period in the same period as the blanking period, the single accumulating period Sa where the single accumulation operation is carried out. Thus, one frame period is constituted by cyclically repeating the single accumulating period Sa and the parallel accumulating periods Ss, Sc, and Sn, after the transfer period.

Moreover, the photo-generated electric charges accumulated in the accumulation well 4 are transferred, in the transfer period, from the accumulation well 4 to the modulation well 5 to store. All the cells perform the transfer operation in the transfer period. Then, the period of this transfer period to transfer period will be made the accumulating period.

Next, with reference to FIG. 15 and FIG. 16, operation in the single accumulating period Sa, the transfer period, the S modulation period (parallel accumulating period Ss), the clear period (parallel accumulating period Sc) and the N modulation period (parallel accumulating period Sn), will be described based on the potential relationship. FIG. 15 is a diagram illustrating the potential relationship for each period with the direction, where the hole potential becomes high, being a positive side. FIG. 15(A) shows the condition at the time of the single accumulation, FIG. 15(B) shows the condition at the time of the transfer, FIG. 15(C) shows the condition at the time of the S modulation or the N modulation (S/N modulation), and FIG. 15(D) shows the condition at the time of the clear. The column on the left side of FIG. 15 shows the condition of the reading cell, and the column on the right side shows the condition of the non-reading cell. In addition, FIG. 15 shows the potential change based on the electric charges, with a satin pattern. In addition, the timing when each cell becomes the reading cell will be shown by the pulse portion of FIG. 17 as will be described later.

FIG. 15 shows the potential relationship of each position, taking the position corresponding to the cutting line of each cell of FIG. 11 in the horizontal axis, and taking the potential with reference to a hole in the vertical axis. From the left side to the right side in FIG. 15, the potentials in the substrate at the positions of one end of the carrier pocket (PKT) 10, the source (S), the other end of the carrier pocket (PKT) 10, the transfer gate (TX) 13 (transfer channel RT portion), the accumulation well region (PD), are shown.

Moreover, FIG. 16 shows changes of the driving voltage for each period. In FIG. 16, the dashed lines show changes of the driving voltage of the select line. FIG. 16 shows the changes of the driving voltage for each period, and the actual driving sequence and the order of the period to set up differ. FIG. 16 shows a setup of the driving voltage shown in FIG. 15 in time order.

In the present embodiment, the same drive is applied to all the cells in the single accumulating period Sa as shown in FIG. 15(A). As shown also in FIG. 16, in the single accumulating period Sa shown in FIG. 15(A), 0.0V is applied to the ring gate (RG) 6, 2.5V is applied to the transfer gate (TX) 13, 1.0V is applied to the drain D, and 1.0V is applied to the source. The drain voltage is set to a relatively low value.

In the single accumulating period, the potential barrier of the transfer channel RT between the accumulation well 4 and the modulation well 5 is made high enough by the transfer transistor TT. The accumulation well 4 is set at a relatively high concentration, and its potential before the accumulation of the electric charges is relatively low. When the accumulation is started, the electric charges are generated by light entering from the opening region 2 of the photo diode PD, and are accumulated in the accumulation well 4. FIG. 15(A) shows the potential increase by the accumulation of the electric charges, with a satin pattern.

Also in the present embodiment, the potential barrier of the transfer channel RT is sufficiently high (potential is high), and the electric charges generated by incident light are accumulated in the accumulation well 4, without being transferred to the modulation well 5.

In the transfer period shown in FIG. 15(B), 0.0V is applied to the ring gate (RG) 6, 0.0V is applied to the transfer gate (TX) 13, 4.0V is applied to the drain D, and 0.0V is applied to the source.

0V is applied to the transfer gate 13, and the potential barrier of the transfer channel RT becomes low enough. Accordingly, the electric charges accumulated in the accumulation well 4 in the above described single accumulating period Sa and in the parallel accumulating periods Ss, Sc, and Sn, as will be described later, flow into in the modulation well 5 through the transfer channel RT. In addition, by setting the drain voltage to a relatively high voltage, the potential gradient is increased to facilitate the transfer of the electric charges. Also in the transfer period shown in FIG. 15(B), all the cells become reading cells and the same driving is applied.

The reading period includes the signal modulation (S modulation) period for mainly reading the signal component (S), the noise modulation (N modulation) period for mainly reading the noise component (N), and the clear period for clearing the residual electric charges in order to read the noise component. The image signal, in which the cell variation and the various kinds of noises are removed, is obtained by reading and comparing the signal component and the noise component. Namely, in the reading period, the S modulation period, the clear period, and the N modulation period are carried out in this order.

The same control is carried out in the S modulation period and in the N modulation period. In the S/N modulation period shown in FIG. 15(C), with respect to the reading cell, as shown in the dashed line of FIG. 16, 2.5V is applied to the ring gate (RG) 6, 2.5V is applied to the transfer gate (TX) 13, and 2.5V is applied to the drain D. Vg−Vths (=2.5−Vths) arises in the source (Vg is the gate voltage and Vths is the threshold voltage of the channel at the time of the S modulation).

The reading is carried out for each line. Only each cell of one line (reading line) out of all the lines becomes a reading cell, and each cell of other lines (non-reading lines) is a non-reading cell. Then, upon completion of reading each reading cell from the reading line, the reading line shifts, and each cell of the following line becomes a reading cell, and the other cells become the non-reading cells. Similarly, the reading (S modulation) of the signal component or the reading (N modulation) of the noise component is carried out by shifting the reading line.

As for the reading cell, the potential barrier of the transfer channel RT is made high by the transfer transistor TT so that the electric charges stored in the modulation well 5 may not flow into the accumulation well 4. Since the voltage of the ring gate 6 is made high, the source potential increases accordingly. The threshold voltage of the channel of the modulation transistor TM changes corresponding to the electric charges stored in the carrier pocket 10. Namely, the source potential of the modulation transistor TM becomes the one corresponding to the generated amount of the photo-generated electric charges, i.e. the incident light, because the photo-generated electric charges accumulated in the accumulation well 4 of the photo diode PD are transferred to the carrier pocket 10.

In addition, as for the non-reading cell, as shown in the solid line of FIG. 16, 0.0V is applied to the ring gate (RG) 6, 2.5V is applied to the transfer gate (TX) 13, and 2.5V is applied to the drain D. Also in this case, Vg−Vth (=0−Vth) arises in the source, however, since the voltage of the ring gate 6 is low, the output of the non-reading cell becomes a level sufficiently lower than the output of the reading cell. Therefore, only the output pixel signal of the reading cell appears at the source line.

In addition, the potential difference applied to the ring gate 6 of the reading cell and the non-reading cell is made high enough, therefore, for example, even when the image is dark or the like, the output pixel signal of the reading cell can be taken out from the source line securely.

In the clear period shown in FIG. 15(D), as for the reading cell, as shown in the dashed line of FIG. 16, 7.0V is applied to the ring gate (RG) 6, 2.5V is applied to the transfer gate (TX) 13, 5.0V is applied to the drain D, and 5.0V is applied to the source.

Accordingly, the potential of the modulation well 5 is made high for the electric charges remaining in the modulation well 5 to flow to the substrate 1a through the N layer 21'. Accordingly, the photo-generated electric charges in the modulation well 5 are removed, thereby enabling the reading (noise modulation) of the noise component.

On the other hand, as for the non-reading cell, as shown in the solid line of FIG. 16, 0.0V is applied to the ring gate (RG) 6, 2.5V is applied to the transfer gate (TX) 13, 5.0V is applied to the drain D, and 5.0V is applied to the source. Accordingly, the potential of the modulation well 5 becomes low and the photo-generated electric charges are stored in the modulation well 5. The reading of the non-reading cell out of the cells per each line has already been completed after the blanking period passes in FIG. 6, however, as for the non-reading cells of lines before the blanking period passes, the reading has not been carried out yet. Then, in the non-reading cells, electric charges are prevented from being discharged from the modulation well 5. The satin-pattern portion with respect to the non-reading cell of FIG. 15 shows that the electric charges, which have not been read, are stored in the modulation well 5.

According to the present embodiment, as described above, the parallel accumulation operation is carried out in the S/N modulation period and the clear period. FIGS. 15(C) and (D) show this parallel accumulation operation. Namely, in the reading period (S/N modulation and clear period), the photo-generated electric charges are accumulated in the accumulation well 4 by increasing the potential barrier of the transfer channel RT. Accordingly, the reading period (modulation and clear period) of the modulation transistor TM will be made the accumulating period (parallel accumulating periods Ss, Sn, and Sc) for accumulating the photo-generated electric charges at the photo diode PD side. In addition, in the parallel accumulating period Ss and Sn of FIG. 15(C), and the parallel accumulating period Sc of FIG. 15(D), the drain voltage is higher as compared with the single accumulating period Sa, and thus the conditions of accumulating the photo-generated electric charges differ. Moreover, as shown in FIGS. 15(C) and (D), the conditions of accumulating the photo-generated electric charges differ slightly between the reading cell and the non-reading cell.

Thus, in the single accumulating period Sa, the S/N modulation period, and the clear period, accumulation of the photo-generated electric charges is carried out in all the cells, and the accumulation time for each cell will be approximately one frame period. In this way, a provision is made to separately constitute the accumulation well 4 for accumulating the electric charges formed at the photo diode PD side and the modulation well 5 formed at the modulation transistor TM side, and to control the potential barrier of the transfer channel RT between both by the transfer transistor TT. Accordingly, the accumulation well 4 and the modulation well 5 can be set to the reading period and the parallel accumulating period of the same period, and thereby the frame rate can be increased.

Next, the operation sequence of each mode of the normal mode and the low-speed shutter mode will be described.

FIG. 17 is a timing chart showing the driving sequence. FIG. 17(A) shows the normal mode and FIG. 17(B) shows the low-speed shutter mode. In FIG. 17, the single accumulating period Sa (line-out period) and the blanking period are combined to be shown as one pulse shape.

In the normal mode of FIG. 17(A), each cell has the accumulating period of one frame period except for the transfer period, and the reading from all the cells completes in one frame period. Since the parallel accumulating period is set up using a time common to the blanking period, it is not necessary to prepare another period for accumulation, and thereby the frame rate can be increased.

FIG. 17(B) shows the driving sequence of the low-speed shutter mode.

The low-speed shutter mode is used, for example, for making the accumulating period longer than one frame period. In the low-speed shutter mode according to the present embodiment, the transfer period is inserted once per a plurality of frame periods.

In an example of FIG. 17(B), the transfer period is inserted once per two frame periods, and the following transfer period is set up at two frame periods after the completion of this transfer period. Therefore, the accumulating period in this case will be made at two frame periods. Accordingly, an image having approximately twice the brightness as compared with the normal mode can be obtained. In addition, in the case of FIG. 17(B), the reading from each cell will be carried out only once per two frame periods, and the frame rate will be one half of the normal mode.

Thus, also in this embodiment, the same effect as the first embodiment can be obtained.

What is claimed is:

1. A solid state imaging device including a reading process, a transfer process, an accumulation process, and a clear process, comprising:
    a plurality of pixels, each including:
        a photoelectric conversion element including a first well, the photoelectric conversion element generating electric charges corresponding to an incident light and the first well accumulating the electric charges;
        a circuit element including a second well storing the electric charges, the circuit element including a terminal, a potential of the terminal being controlled corresponding to the electric charges stored in the second well;
        a transfer element transferring the electric charges between the first well and the second well via a channel of the transfer element; and
        a discharge element discharging the electric charges from the first well via a channel of the discharge element,
            during the accumulation process, a potential of the discharge element channel being controlled to be lower than a potential of the transfer element channel in order to discharge overflowed electric charges from the first well when the overflowed electric charges are generated in the photoelectric conversion element and a potential of the first well is higher than the potential of the discharge element channel, the accumulation process being executed during the reading process,
            during the transfer process, the potential of the transfer element channel being controlled to be lower than the potential of the first well and the potential of the discharge element channel being controlled to be higher than the potential of the first well in order to transfer the electric charges from the first well to the second well, and
            during the clear process, the potential of the transfer element channel being controlled to be higher than the potential of the first well and the potential of the discharge element channel being controlled to be lower than the potential of the first well in order to discharge the electric charges from the first well, the clear process being executed during the reading process.

2. The solid state imaging device according to claim 1, during the reading process, a potential of the transfer element channel being controlled to be higher than a potential of the second well.

3. The solid state imaging device according to claim 1, the reading process including a signal reading process reading a signal component while the electric charges are stored in the second well, an eliminating process eliminating the electric charges in the second well, and a noise reading process reading a noise component while the electric charges are not stored in the second well.

4. The solid state imaging device according to claim 3, the circuit element including a gate, a source, and a drain, the terminal being electrically connected to the source of the circuit element, a voltage applied to the gate of the circuit element being equal to a voltage applied to the drain of the circuit element in the signal reading process.

5. The solid state imaging device according to claim 3, the circuit element including a gate, a source, and a drain, the terminal being electrically connected to the source of the circuit element, a voltage applied to the gate of the circuit element in the signal reading process being smaller than a voltage applied to the gate of the circuit element in the eliminating process, a voltage applied to the drain of the circuit element in the signal reading process being smaller than a voltage applied to the drain of the circuit element in the eliminating process.

6. The solid state imaging device according to claim 3, the circuit element including a gate, a source, and a drain, the terminal being electrically connected to the source of the circuit element, a voltage being applied to the source of the circuit element in the eliminating process being the same as a voltage being applied to the drain of the circuit element in the eliminating process.

7. The solid state imaging device according to claim 3, the circuit element including a gate, a source, a drain, and a carrier pocket, the terminal being electrically connected to the source of the circuit element, the carrier pocket being located in the second well, the electric charges in the second well being positioned in the carrier pocket.

8. The solid state imaging device according to claim 3, further comprising:
a signal outputting circuit electrically connecting the plurality of pixels, the signal component and the noise component being compared to generate a pixel signal.

9. A solid state imaging device including a reading process and an accumulation process, comprising:
a plurality of pixels, each including:
a photoelectric conversion element including a first well, the photoelectric conversion element generating electric charges corresponding to an incident light and the first well accumulating the electric charges;
a circuit element including a second well storing the electric charges, the circuit element including a terminal, a potential of the terminal being controlled corresponding to the electric charges stored in the second well;
a transfer element transferring the electric charges between the first well and the second well via a channel of the transfer element; and
a discharge element discharging the electric charges from the first well via a channel of the discharge element,
during the reading process, a potential of the transfer element channel being controlled to be higher than a potential of the second well,
during the accumulation process, a potential of the discharge element channel being controlled to be lower than the potential of the transfer element channel in order to discharge overflowed electric charges from the first well when the overflowed electric charges are generated in the photoelectric conversion element and the potential of the first well is higher than the potential of the discharge element channel, the accumulation process being executed during the reading process.

10. The solid state imaging device according to claim 9, during a clear process, the potential of the transfer element channel being controlled to be higher than the potential of the first well and the potential of the discharge element channel being controlled to be lower than the potential of the first well in order to discharge the electric charges from the first well, the clear process being executed during the reading process.

11. The solid state imaging device according to claim 9, the reading process including a signal reading process reading a signal component while the electric charges are stored in the second well, an eliminating process eliminating the electric charges in the second well, and a noise reading process reading a noise component while the electric charges are not stored in the second well.

12. The solid state imaging device according to claim 11, the circuit element including a gate, a source, and a drain, the terminal being electrically connected to the source of the circuit element, a voltage applied to the gate of the circuit element in the signal reading process being smaller than a voltage applied to the gate of the circuit element in the eliminating process, a voltage applied to the drain of the circuit element in the signal reading process being smaller than a voltage applied to the drain of the circuit element in the eliminating process.

13. The solid state imaging device according to claim 11, the circuit element including a gate, a source, and a drain, the terminal being electrically connected to the source of the circuit element, a voltage being applied to the source of the circuit element in the eliminating process being the same as a voltage being applied to the drain of the circuit element in the eliminating process.

14. The solid state imaging device according to claim 11, the circuit element including a gate, a source, a drain, and a carrier pocket, the terminal being electrically connected to the source of the circuit element, the carrier pocket being located in the second well, the electric charges in the second well being positioned in the carrier pocket.

15. A solid state imaging device including a reading process and a clear process, comprising:
a plurality of pixels, each including:
a photoelectric conversion element including a first well, the photoelectric conversion element generating electric charges corresponding to an incident light and the first well accumulating the electric charges;
a circuit element including a second well storing the electric charges, the circuit element including a terminal, a potential of the terminal being controlled corresponding to the electric charges stored in the second well;
a transfer element transferring the electric charges between the first well and the second well via a channel of the transfer element; and
a discharge element discharging the electric charges from the first well via a channel of the discharge element,
during the reading process, a potential of the transfer element channel being controlled to be higher than a potential of the second well, and
during the clear process, a potential of the transfer element channel being controlled to be higher than a potential of the first well and a potential of the discharge element channel being controlled to be lower than a potential of the first well in order to discharge the electric charges from the first well, the clear process being executed during the reading process.

16. The solid state imaging device according to claim 15, the reading process including a signal reading process reading a signal component while the electric charges are stored in the second well, an eliminating process eliminating the electric charges in the second well, and a noise reading process reading a noise component while the electric charges are not stored in the second well.

17. The solid state imaging device according to claim 16, the circuit element including a gate, a source, and a drain, the terminal being electrically connected to the source of the circuit element, a voltage applied to the gate of the circuit element being equal to a voltage applied to the drain of the circuit element in the signal reading process.

18. The solid state imaging device according to claim 16, the circuit element including a gate, a source, and a drain, the terminal being electrically connected to the source of the circuit element, a voltage applied to the gate of the circuit element in the signal reading process being smaller than a voltage applied to the gate of the circuit element in the eliminating process, a voltage applied to the drain of the circuit element in the signal reading process being smaller than a voltage applied to the drain of the circuit element in the eliminating process.

19. The solid state imaging device according to claim 16, the circuit element including a gate, a source, and a drain, the terminal being electrically connected to the source of the circuit element, a voltage being applied to the source of the circuit element in the eliminating process being the same as a voltage being applied to the drain of the circuit element in the eliminating process.

20. The solid state imaging device according to claim 16, the circuit element including a gate, a source, a drain, and a carrier pocket, the terminal being electrically connected to the source of the circuit element, the carrier pocket being located in the second well, the electric charges in the second well being positioned in the carrier pocket.

* * * * *